US012431467B2

(12) United States Patent
Chang et al.

(10) Patent No.: US 12,431,467 B2
(45) Date of Patent: *Sep. 30, 2025

(54) FAN-OUT PACKAGES PROVIDING ENHANCED MECHANICAL STRENGTH AND METHODS FOR FORMING THE SAME

(71) Applicant: Taiwan Semiconductor Manufacturing Company Limited, Hsinchu (TW)

(72) Inventors: Jen-Yuan Chang, Hsinchu (TW); Chia-Ping Lai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 22 days.

This patent is subject to a terminal disclaimer.

(21) Appl. No.: 18/510,723

(22) Filed: Nov. 16, 2023

(65) Prior Publication Data

US 2024/0088102 A1 Mar. 14, 2024

Related U.S. Application Data

(63) Continuation of application No. 17/474,358, filed on Sep. 14, 2021, now Pat. No. 11,862,610.

(Continued)

(51) Int. Cl.
*H01L 25/065* (2023.01)
*H01L 21/56* (2006.01)
(Continued)

(52) U.S. Cl.
CPC ........ *H01L 25/0657* (2013.01); *H01L 21/561* (2013.01); *H01L 21/565* (2013.01);
(Continued)

(58) Field of Classification Search
CPC . H01L 25/0657; H01L 25/0652; H01L 25/50; H01L 21/561; H01L 21/565;
(Continued)

(56) References Cited

U.S. PATENT DOCUMENTS

| 11,862,610 | B2 * | 1/2024 | Chang | H01L 24/96 |
| 2009/0001574 | A1 | 1/2009 | Fang et al. | |
| 2016/0307872 | A1 * | 10/2016 | Chen | H01L 21/4857 |

OTHER PUBLICATIONS

TW Patent and Trademark Office; TW Application No. 110149100; Notice of Allowance mailed Feb. 8, 2025; 14 pages.

* cited by examiner

*Primary Examiner* — Timor Karimy
(74) *Attorney, Agent, or Firm* — The Marbury Law Group, PLLC

(57) ABSTRACT

An array of complementary die sets is attached to a carrier substrate. A continuous complementary-level molding compound layer is formed around the array of complementary die sets. An array of primary semiconductor dies is attached to the array of complementary die sets. A continuous primary-level molding compound layer is formed around the array of primary semiconductor dies. The bonded assembly is diced by cutting along directions that are parallel to edges of the primary semiconductor dies. The sidewalls of the complementary dies are azimuthally tilted relative to sidewalls of the primary semiconductor dies, or major crystallographic directions of a single crystalline material in the carrier substrate are azimuthally tilted relative to sidewalls of the primary semiconductor dies.

20 Claims, 19 Drawing Sheets

Related U.S. Application Data

(60) Provisional application No. 63/162,982, filed on Mar. 18, 2021.

(51) Int. Cl.
*H01L 23/00* (2006.01)
*H01L 25/00* (2006.01)

(52) U.S. Cl.
CPC .............. *H01L 24/11* (2013.01); *H01L 24/13* (2013.01); *H01L 24/16* (2013.01); *H01L 24/19* (2013.01); *H01L 24/20* (2013.01); *H01L 24/81* (2013.01); *H01L 24/96* (2013.01); *H01L 25/0652* (2013.01); *H01L 25/50* (2013.01); *H01L 2224/13025* (2013.01); *H01L 2224/16146* (2013.01); *H01L 2224/211* (2013.01); *H01L 2924/1437* (2013.01)

(58) Field of Classification Search
CPC . H01L 2924/1437; H01L 24/11; H01L 24/13; H01L 24/16; H01L 24/19; H01L 24/20; H01L 24/81; H01L 2224/13025; H01L 2224/16146; H01L 2224/211
See application file for complete search history.

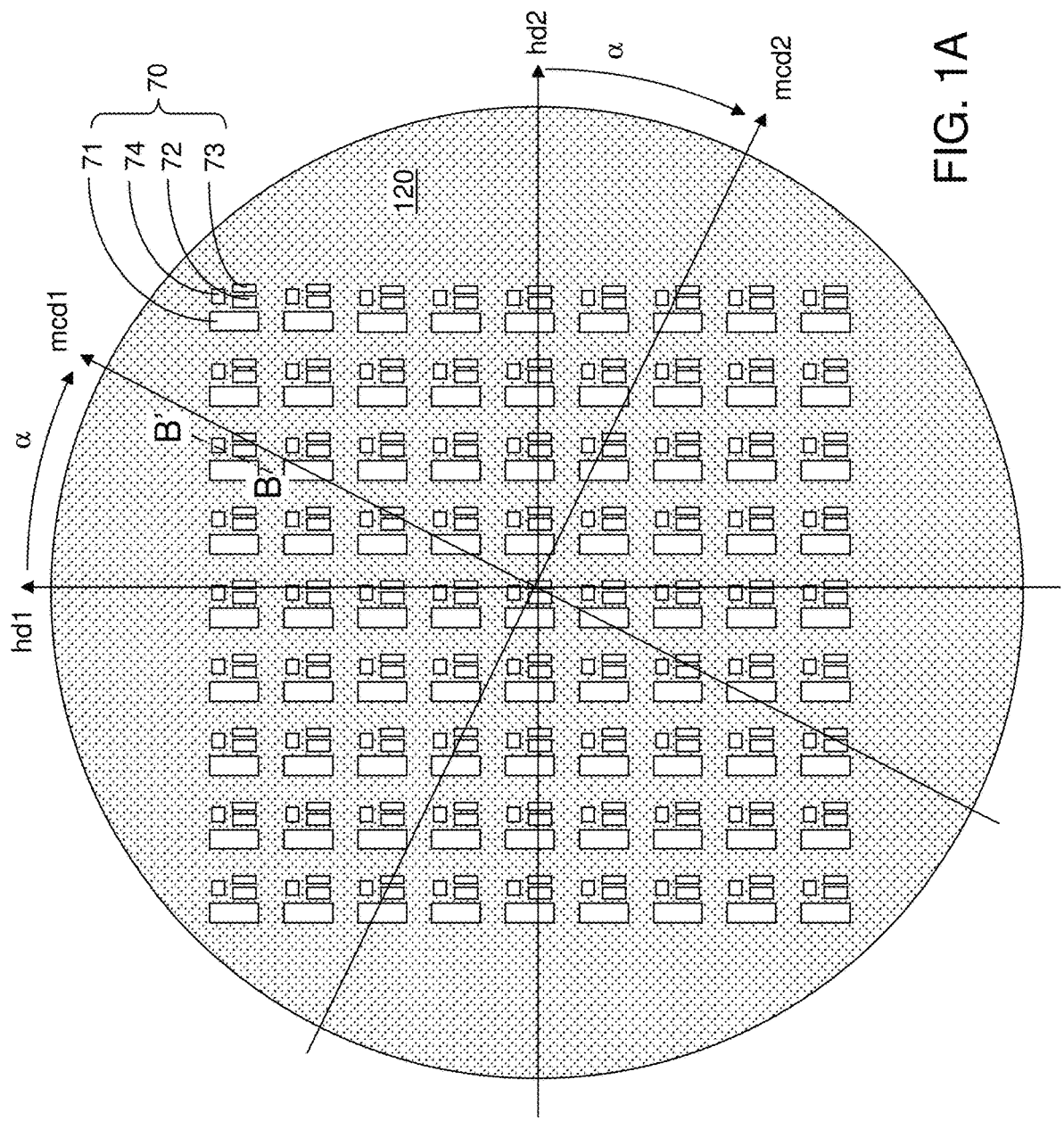

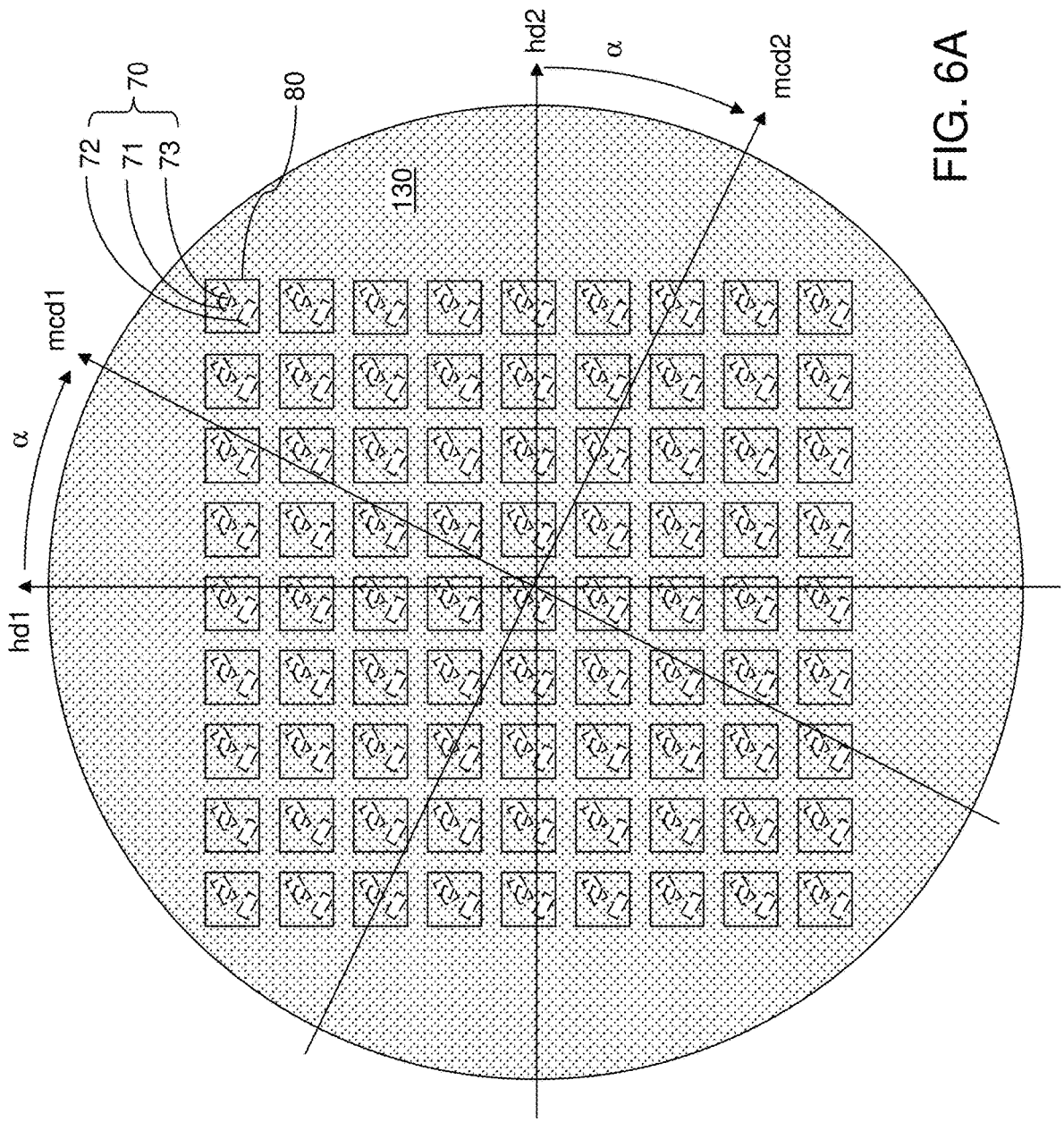

FAN-OUT PACKAGES PROVIDING ENHANCED MECHANICAL STRENGTH AND METHODS FOR FORMING THE SAME

RELATED APPLICATIONS

This application is a continuation application of U.S. application Ser. No. 17/474,358 entitled "Fan-Out Packages Providing Enhanced Mechanical Strength and Methods For Forming the Same," filed on Sep. 14, 2021, which claims the benefit of priority from U.S. Provisional Application No. 63/162,982 entitled "SoIC stress reduction by chip on wafer lattice shift," filed on Mar. 18, 2021, the entire contents of both of which are incorporated herein by reference for all purposes.

BACKGROUND

Fan-out wafer level packages are formed by stacking dies on a carrier wafer and subsequently dicing the assembly of semiconductor dies and the carrier wafer. Mechanical stress generated around the bonded assemblies of dies and the carrier wafer during the stacking processes and during the dicing process may cause undesirable cracking. Consequently, the yield of devices during formation of the fan-out wafer level packages is decreased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top-down view of a first exemplary structure after attaching an array of complementary die sets to a single crystalline semiconductor carrier substrate according to a first embodiment of the present disclosure.

FIG. 6A is a top-down view of the second exemplary structure after attaching an array of primary semiconductor dies to the array of complementary die sets according to the second embodiment of the present disclosure.

DETAILED DESCRIPTION

Figure 1B:
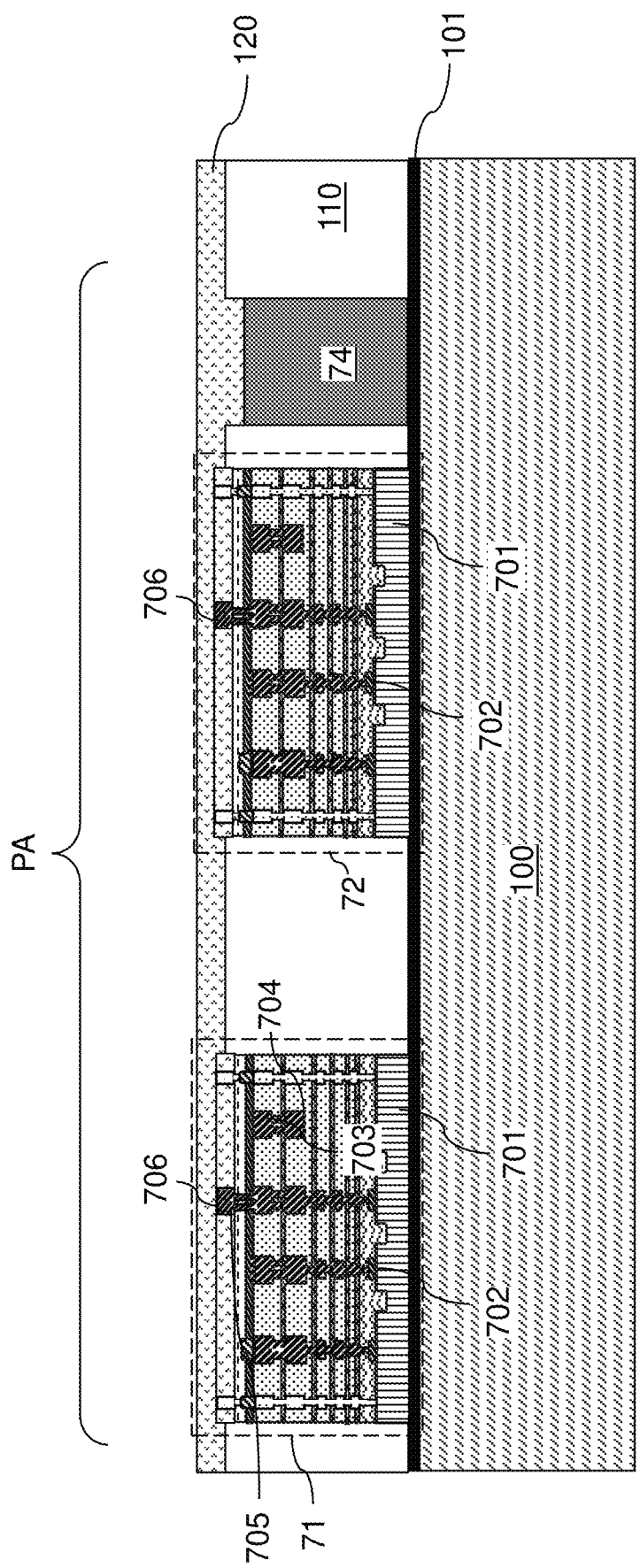
FIG. 1B a vertical cross-sectional view of the first exemplary structure along the vertical plane B-B' of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a semiconductor die packaging process for forming fan-out wafer level packages that are resistant to stress cracking. During fabrication of fan-out wafer level packages, an array of complementary die sets may be arranged over a carrier wafer, and an array of primary semiconductor dies may be bonded to the array of complementary die sets. Each complementary die set includes at least one complementary semiconductor die. Each primary semiconductor die may be a system-on-integrated-circuit (SoIC) die that is configured to be bonded to a respective complementary die set. Molding compound layers laterally surround bonded assemblies of a primary semiconductor die and a complementary die set. This configuration is prone to mechanical damage due to structural stress concentration the stacking process and the dicing process. In this embodiment, fragments may be generated from the semiconductor dies and the carrier wafer.

According to an aspect of the present disclosure, major crystallographic direction in the carrier wafer, the primary semiconductor die, and/or the complementary dies may be azimuthally offset from the horizontal directions of the sidewalls of the primary semiconductor dies. Generally, major crystallographic directions may be directions along which cracks may propagate within the carrier wafer, within the primary semiconductor dies, and within the complementary dies. Since the dicing channels are parallel to the sidewalls of the primary semiconductor dies in embodiments in which the primary semiconductor dies have orthogonal sidewalls, major crystallographic direction in the carrier wafer, the primary semiconductor die, and/or the complementary dies may be azimuthally offset from the directions of the dicing channels, and mechanical stress during dicing may be reduced.

Generally, sidewalls of a semiconductor die that are arranged along a direction of periodicity within an array of semiconductor dies are prone to mechanical damage during stacking and during dicing. According to another aspect of the present disclosure, the primary semiconductor dies and the complementary dies may be oriented during stacking such that sidewalls of the primary semiconductor dies and the complementary dies are not parallel to the direction of periodicity during formation of an array of bonded semiconductor dies.

For example, the primary semiconductor dies may be system-on-integrated-circuit (SoIC) dies, which are arranged as an array over a single crystalline silicon carrier substrate such that the major horizontal crystallographic directions of the single crystalline silicon carrier substrate are azimuthally offset from the two orthogonal directions of periodicity of the array of primary semiconductor dies. The azimuthal offset angle may be greater than 0.5 degree. As used herein, two directions are azimuthally offset from each other if the two directions differ by a finite angle (i.e., an azimuthal rotation angle around a vertical direction) in a plan view along a vertical direction, which is a view along a direction that is perpendicular to the top surface of the carrier substrate 100 in this embodiment.

As used herein, all tilt angles between two directions, such as azimuthal offset angles, are measured between a pair of straight lines such that the measured value of the tilt angles is in a range from 0 degrees to 90 degrees. In other words, it is understood that all angle measurements are made such that the measured angle is zero, an acute angle, or an orthogonal angle (90 degrees).

In another example, major crystallographic directions of the single crystalline substrate of each SoIC die may be azimuthally offset from the directions of the sidewalls of a respective SoIC die. In some embodiments, the azimuthal offset angle between the major crystallographic directions of the single crystalline substrate of an SoIC die and the sidewall of the SoIC die may be greater than 0.5 degree, and may be 45 degrees. In this embodiment, the silicon lattice directions (such as <100> directions) of the single crystalline substrate of an SoIC die may be different from the directions of the periodicity in the array of primary semiconductor dies, and thus, cracking of the primary semiconductor dies during stacking and dicing may be minimized.

In some embodiments, the sizes and/or directions of some semiconductor dies (such as the complementary dies) may be inconsistent and/or incongruent with the size and the direction of another semiconductor die (such as the primary semiconductor die). In some embodiments, the major horizontal crystallographic directions of substrates of the semiconductor dies within each bonded set of semiconductor dies may be different from one another, and/or may be different from the major crystallographic directions of the carrier substrate, and/or may be different from the directions of periodicity in a rectangular array of bonded semiconductor dies as formed over the carrier substrate. The various embodiments of the present disclosure are now described in detail with reference to accompanying drawings.

Referring to FIGS. 1A and 1B, a carrier substrate 100 for performing a fan-out wafer-level packaging process thereupon is provided. The carrier substrate 100 may be a semiconductor substrate, an insulating substrate, a conductive substrate, or a composite substrate including a stack of at least two different materials. According to an embodiment of the present disclosure, the carrier substrate 100 may be a single crystalline semiconductor carrier substrate such as a single crystalline silicon carrier substrate, i.e., a carrier substrate composed of single crystalline silicon material.

In one embodiment, the carrier substrate 100 may comprise a commercially available silicon wafer. In one embodiment, the carrier substrate 100 may be a (100) silicon wafer, i.e., a single crystalline silicon wafer having a planar major surface including a (100) crystallographic plane so that a crystallographic direction of the single crystalline material of the single crystalline silicon wafer is perpendicular to the physically exposed planar (100) crystallographic plane. In this embodiment, the (100) silicon wafer may include a direction and a direction selected from a pair of orthogonal in-plane horizontal directions, i.e., a pair of horizontal directions that are contained within the plane including the top surface of the silicon wafer. Alternatively, the (100) silicon wafer may include a direction (which is a <110> direction) and a [0 1-1] direction (which is another <110> direction) selected from a pair of orthogonal in-plane horizontal directions.

Alternatively, the carrier substrate 100 may be a (110) silicon wafer, i.e., a single crystalline silicon wafer having a planar major surface including a (110) crystallographic plane so that a crystallographic direction of the single crystalline material of the single crystalline silicon wafer is perpendicular to the physically exposed planar (110) crystallographic plane. In this embodiment, the (110) silicon wafer may include a [1-1 0] direction (which is one of <110> direction) and a direction selected from a pair of orthogonal in-plane horizontal directions. Alternatively, the (110) silicon wafer may include a [1-1 2] direction (which is one of <112> direction) and a [1-1-1] direction (which is one of <111> directions) selected from a pair of orthogonal in-plane horizontal directions.

In a further alternative, the carrier substrate 100 may be a (111) silicon wafer, i.e., a single crystalline silicon wafer having a planar major surface including a (111) crystallographic plane so that a crystallographic direction of the single crystalline material of the single crystalline silicon wafer is perpendicular to the physically exposed planar (111) crystallographic plane. In this embodiment, the (111) silicon wafer may include a [1-1 0] direction (which is one of <110> directions) and a [1 1-2] direction (which is one of <112> directions) selected from a pair of orthogonal in-plane horizontal directions.

As used herein, any in-plane crystallographic direction that may be included in a set of two orthogonal in-plane crystallographic directions with lowest Miller indices (i.e., Miller indices of which the sum of absolute values of the components of the Miller indices is the lowest) for a (100) semiconductor wafer, a (110) semiconductor wafer, and a (111) semiconductor wafer is herein referred to as a "major" in-plane crystallographic direction. Thus, the major in-plane crystallographic directions of a single crystalline silicon substrate may include <100> directions, <110> directions, <111> directions, and <112> directions for the purposes of the present disclosure.

An adhesion layer 101 may be applied to a top surface of the carrier substrate 100. The adhesion layer 101 includes an adhesive material that may be subsequently removed after dicing an assembly of the carrier substrate 100 and structures attached thereupon. For example, the adhesion layer 101 may include a polymer material.

An array of complementary die sets 70 may be subsequently attached to the carrier substrate 100. Each complementary die (71, 72, 73, 74) is disposed within a respective package area PA, which may be a rectangular area. Each complementary die set 70 includes at least one complementary die (71, 72, 73, 74), which may be a single complementary die or a plurality of complementary dies. As used herein, a complementary die refers to any die that may be attached directly or indirectly (e.g., through an intermediate complementary die) to another die (which is referred to as a primary semiconductor die). Thus, designation of a semiconductor die as a "complementary die" does not mean that the functionality of the semiconductor die is complementary to the functionality of another die, but merely mean that the semiconductor die may be combined with an additional semiconductor die (for example, through bonding) to provide enhanced functionality.

The array of complementary die sets 70 may be arranged on the adhesion layer 101 as a periodic rectangular array having a first periodicity along a first horizontal direction hd1 and having a second periodicity along a second horizontal direction hd2 that is perpendicular to the first horizontal direction hd1. According to an embodiment of the present disclosure, the carrier substrate 100 may comprise a single crystalline semiconductor carrier substrate (such as a single crystalline silicon carrier substrate) and may have a planar top surface contained within a (100) plane, a (110) plane, or a (111) plane selected from the crystallographic planes of the a single crystalline semiconductor carrier substrate. In this embodiment, each of major in-plane crystallographic directions within the single crystalline semiconductor carrier substrate may be azimuthally offset from the first horizontal direction hd1 and from the second horizontal direction hd2 by a respective azimuthal offset angle a, which may be at least 0.5 degree, and/or at least 1.0 degrees, and/or at least 2 degrees, and/or at least 3 degrees, and/or at least 4 degrees, and/or at least 5 degrees, and/or at least 6 degrees, and/or at least 8 degrees, and/or at least 10 degrees.

In an illustrative example, the single crystalline semiconductor carrier substrate may be a (100) substrate, a first major in-plane crystallographic direction mcd1 may be a direction and a second major in-plane crystallographic direction mcd2 may be a direction. Alternatively, a first major in-plane crystallographic direction mcd1 may be a direction and a second major in-plane crystallographic direction mcd2 may be a [0 1-1] direction. In this embodiment, the first horizontal direction hd1 and the second horizontal direction hd2 may be selected such that azimuthal offset angles a from the in-plane <100> directions and the in-plane <110> directions is at least 22.5 degrees.

Generally, non-zero azimuthal offset angles a between the major in-plane crystallographic directions of the carrier substrate 100 and the directions of periodicity in the array of complementary die set 70 reduces deleterious effects (such as cracking of the carrier substrate 100) due to mechanical stress during subsequent packaging process (e.g., application of molding compounds and dicing) by directing the mechanical stress along a direction that is different from the major in-plane crystallographic directions of the carrier substrate 100.

Each complementary die (71, 72, 73, 74) within a complementary die set 70 may be arranged within the area of a respective primary die to be subsequently attached to the complementary die set 70. Each complementary die (71, 72, 73, 74) within a complementary die set 70 may have a respective pair of lengthwise sidewalls extending along a respective lengthwise direction, and a respective pair of widthwise sidewalls extending along a respective widthwise direction that is perpendicular to the respective lengthwise direction. In one embodiment, each complementary die (71, 72, 73, 74) may have a respective horizontal cross-sectional shape of a rectangle, a rounded rectangle, or a shape derived from a rectangle by cutting corner edges.

Generally, each complementary die (71, 72, 73, 74) may be orientated such that the lengthwise sidewalls and the widthwise sidewalls may be parallel to the first horizontal direction hd1 and the second horizontal direction hd2 (i.e., the directions of periodicity of the two-dimensional rectangular array of the complementary die sets 70), or alternatively, at least one of the complementary die (71, 72, 73, 74) within each complementary die set 70 has a lengthwise sidewall or a widthwise sidewall that is not parallel to, and is not orthogonal to, any of the first horizontal direction hd1 and the second horizontal direction hd2. While the embodiment illustrated in FIG. 1A describes a configuration in which the each complementary die (71, 72, 73, 74) is orientated such that the lengthwise sidewalls and the widthwise sidewalls are parallel to the first horizontal direction hd1 and the second horizontal direction hd2, embodiments are expressly contemplated herein (and is indeed described in a subsequent section) in which the at least one of the complementary die (71, 72, 73, 74) within each complementary die set 70 has a lengthwise sidewall or a widthwise sidewall that is not parallel to, and is not orthogonal to, any of the first horizontal direction hd1 and the second horizontal direction hd2.

In embodiments in which a complementary die set 70 includes a plurality complementary dies (71, 72, 73, 74), the plurality of complementary dies (71, 72, 73, 74) may be arranged in a manner that does not have an areal overlap with the plurality of complementary dies (71, 72, 73, 74). Alternatively, at least two of the plurality of complementary dies (71, 72, 73, 74) may be stacked vertically, provided that the height of the stack remains comparable to the height of another complementary die or there is no other complementary die within the complementary die set 70. In one embodiment, one of the complementary dies (71, 72, 73, 74) may comprise a dummy complementary die 74, which takes up volumes and provide mechanical support and does not provide any electrical functionality.

Generally, at least one, a plurality, and/or each, of the complementary dies (71, 72, 73, 74) may include a respective semiconductor substrate (which is herein referred to as a complementary semiconductor substrate 701), a respective set of semiconductor devices (which is herein referred to as complementary semiconductor devices 702), a respective set of metal interconnect structures (which is herein referred to as complementary metal interconnect structures 703), a respective set of dielectric material layers (which is herein referred to as complementary dielectric material layers 704), and a respective array of metal bump structures (which is herein referred to complementary metal bump structures 705).

According to an embodiment of the present disclosure, each of the complementary dies (71, 72, 73, 74) may be manufactured and diced prior to placement within the two-dimensional rectangular array of the complementary die sets 70 such that the straight sidewalls (such as the lengthwise sidewalls and the widthwise sidewalls) of at least one, or each, of the complementary semiconductor substrates 701 has a respective set of major in-plane crystallographic directions that are not parallel to, and are not orthogonal to, each of the first horizontal directions hd1 and the second horizontal directions hd2. In other words, each of the <100> directions, the <110> directions, the <111> directions, and the <112> directions of the single crystalline semiconductor materials of the complementary semiconductor substrates 701, if present within the horizontal plane that is parallel to the planar surfaces of the complementary semiconductor substrates 701 contacting the adhesion layer 101, is azimuthally offset from the first horizontal direction hd1 and from the second horizontal direction hd2 by a respective azimuthal offset angle, which is herein referred to as a complementary substrate crystallographic offset angle. In one embodiment, each of the complementary substrate crystallographic offset angles may be at least 0.5 degree, and/or at least 1.0 degrees, and/or at least 2 degrees, and/or at least 3 degrees, and/or at least 4 degrees, and/or at least 5 degrees, and/or at least 6 degrees, and/or at least 8 degrees, and/or at least 10 degrees. In an illustrative example, if a complementary semiconductor substrate 701 includes a (100) silicon substrate, the direction of the complementary semiconductor substrate 701 may be azimuthally offset from the first horizontal direction hd1 by 22.5 degrees clockwise and the direction of the complementary semiconductor substrate 701 may be azimuthally offset from the first horizontal direction hd1 by 22.5 degrees counterclockwise.

Generally, non-zero complementary substrate crystallographic offset angles between the major in-plane crystallographic directions of the complementary semiconductor substrates 701 and the directions of periodicity (i.e., the first horizontal direction hd1 and the second horizontal direction hd2) in the array of complementary die set 70 reduces deleterious effects (such as cracking of the complementary semiconductor substrates 701) due to mechanical stress during subsequent packaging process (e.g., application of molding compounds and dicing) by directing the mechanical stress along a direction that is different from the major in-plane crystallographic directions of the complementary semiconductor substrates 701.

Generally, each of the complementary dies (71, 72, 73, 74) may be any semiconductor die or a dummy die. In an illustrative example, one or more of the complementary dies (71, 72, 73, 74) may include a system-on-chip (SoC) die such as an application processor die, a central processing unit die, a graphic processing unit die, or a memory die such as a high bandwidth memory (HBM) die that includes a vertical stack of static random access memory dies. In one embodiment, the complementary dies (71, 72, 73, 74) may comprise a complementary die (herein referred to as a first complementary die) that comprises a high bandwidth memory (HBM) die including a vertical stack of static random access memory (SRAM) dies are interconnected to one another through microbumps.

A continuous complementary-level molding compound layer 110 may be formed around the array of complementary die sets 70 and over the carrier substrate 100. For example, an epoxy molding compound (EMC) may be applied to the gaps between the complementary dies (71, 72, 73, 74) that are attached to the carrier substrate 100. The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the adhesive layer 101 if the adhesive layer includes a thermally debonding material. For example, the curing temperature of the EMC may be in a range from 125° C. to 150° C.

The EMC may be cured at a curing temperature to form a first EMC matrix that laterally surrounds and embeds each of the complementary dies (71, 72, 73, 74). The first EMC matrix is the continuous complementary-level molding compound layer 110, which is a layer of a molding compound that continuous extends around the complementary dies, of which the level is herein referred to as a complementary level.

According to an aspect of the present disclosure, each of the complementary dies (71, 72, 73, 74) may comprise a respective array of complementary metal bump structures 705. For example, if a complementary die set 70 includes a first complementary die 71, a second complementary die 72, and a third complementary die 73, etc., each of the first complementary dies 71 comprises a respective first array of complementary metal bump structures 705, each of the second complementary dies 72 comprises a respective second array of complementary metal bump structures 705, each of the third complementary dies 73 comprises a respective third array of complementary metal bump structures 705, etc. Each array of complementary metal bump structures 705 may comprise an array of metal pads or an array of copper pillar bumps.

In one embodiment, at least one, or each, of the complementary dies (71, 72, 73, 74) may comprise a rectangular periodic array of complementary metal bump structures 705 that are arranged with a first periodicity along a horizontal direction extending along the lengthwise sidewalls of a respective complementary die (71, 72, 73, 74) and arranged with a second periodicity along another horizontal direction extending along the widthwise sidewalls of the respective complementary die (71, 72, 73, 74). In embodiments in which each lengthwise sidewall and each widthwise sidewall of the complementary dies (71, 72, 73, 74) are parallel to the first horizontal direction hd1 or the second horizontal direction hd2, each rectangular periodic array of complementary metal bump structures 705 may have a periodicity along the first horizontal direction hd1 and along the second horizontal direction hd2.

An array of solder portions 706 may be formed on each array of complementary metal bump structures 705. A continuous underfill layer, which is herein referred to as a continuous inter-mold underfill layer 120, is formed around the array of solder portions 706 and over the continuous complementary-level molding compound layer 110.

Figure 2A:
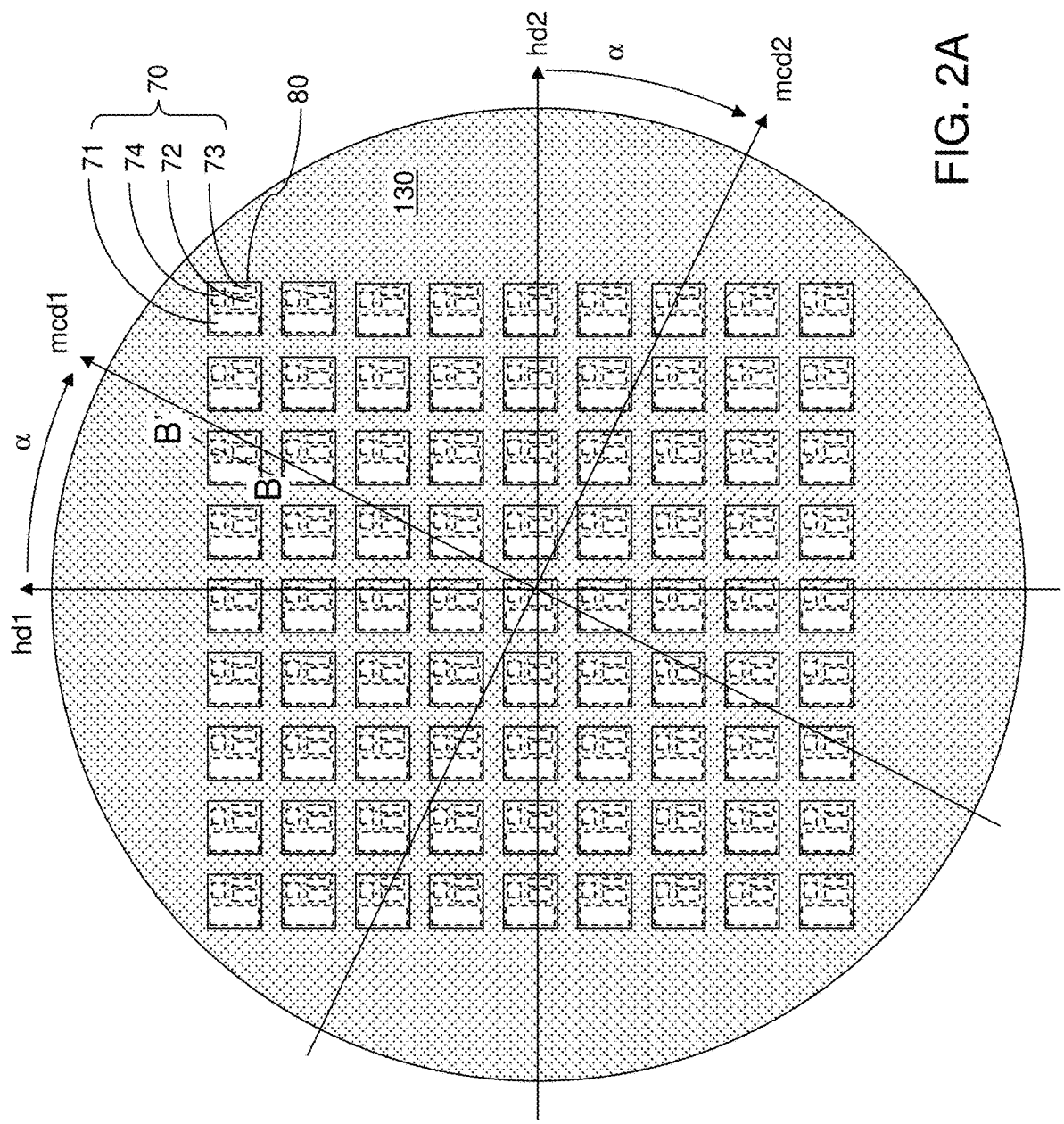
FIG. 2A is a top-down view of the first exemplary structure after attaching an array of primary semiconductor dies to the array of complementary die sets according to the first embodiment of the present disclosure.
Figure 2B:
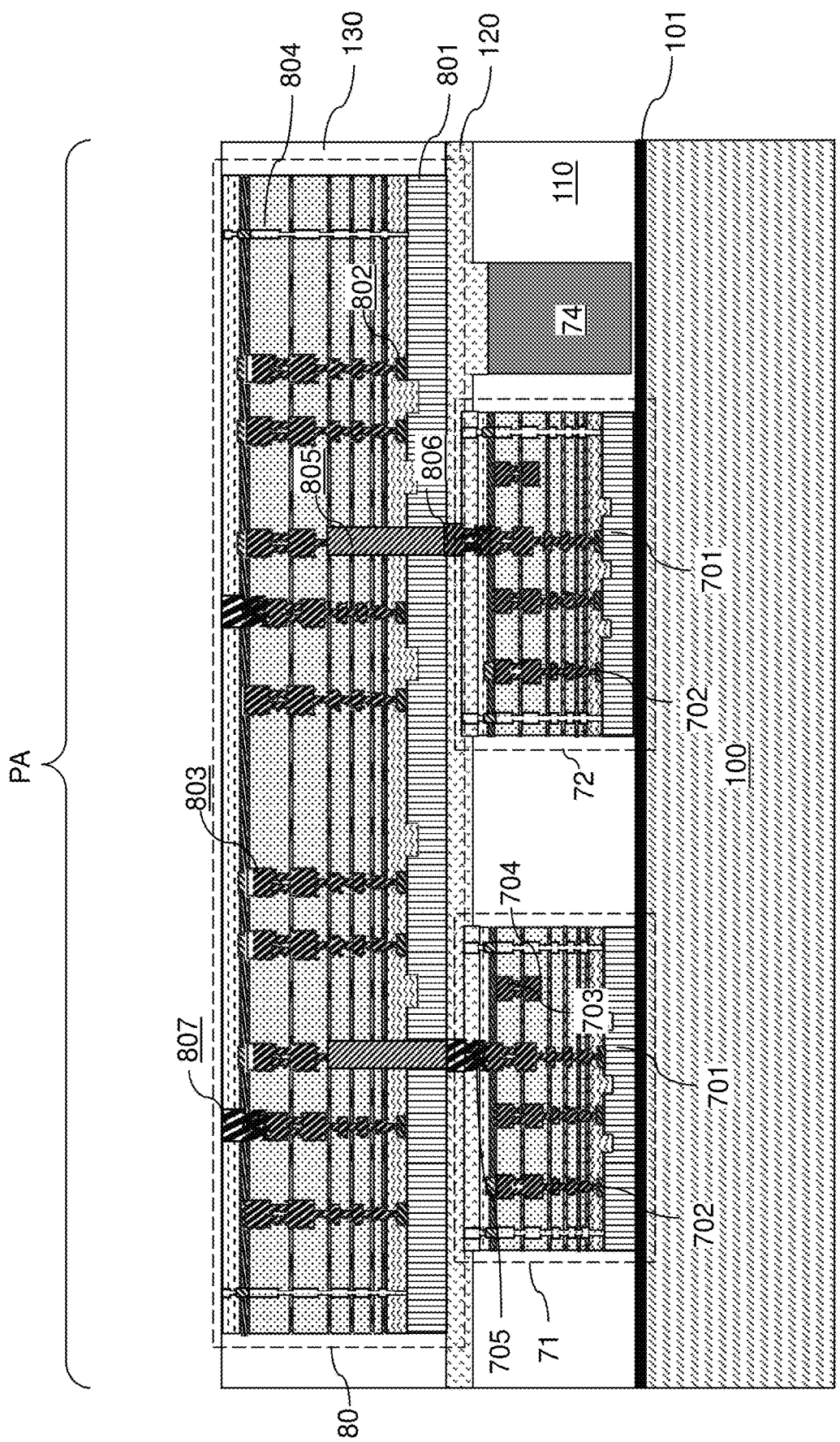
FIG. 2B a vertical cross-sectional view of the first exemplary structure along the vertical plane B-B' of FIG. 2A.

Referring to FIGS. 2A and 2B, an array of primary semiconductor dies 80 may be attached to the array of complementary die sets 70. As used herein, a primary semiconductor die refers to any semiconductor die to which another semiconductor die (such as a complementary semiconductor die) may be attached. Thus, designation of a semiconductor die as a "primary semiconductor die" does not mean that the functionality of the semiconductor die is primary, i.e., more important than the functionality of another die, but merely mean that the semiconductor die may be combined with an additional semiconductor die (for example, through bonding) to provide enhanced functionality. In one embodiment, the primary semiconductor die 80 of the present disclosure may comprise a system-on-chip (SoC) die.

In an illustrative example, each primary semiconductor die 80 may include a semiconductor substrate (which is herein referred to as a primary semiconductor substrate 801), a set of semiconductor devices (which is herein referred to as primary semiconductor devices 802), a set of metal interconnect structures (which is herein referred to as primary metal interconnect structures 803) that are embedded in dielectric material layers (which are herein referred to as primary dielectric material layers 804). A set of through-substrate via structures 805 may vertically extend through the primary semiconductor substrate 801. At least one set of metal bump structures, which is herein referred to as at least one set of primary metal bump structures 806, may be attached to the through-substrate via structures 805. Each set of primary metal bump structures 806 may be arranged with the same periodicity as a complementary metal bump structure 705 within a respective one of the complementary dies (71, 72, 73, 74). The number of sets of primary metal bump structures 806 in each primary semiconductor die 80 may be the same as the total number of complementary dies (71, 72, 73, 74) that are subsequently directly attached to the primary semiconductor die 80.

In one embodiment, the area of a primary semiconductor die 80 may have an areal overlap with a predominant fraction (i.e., more than 50%) of each complementary die (71, 72, 73, 74). In one embodiment, the area of a primary semiconductor die 80 may have an areal overlap with more than 80%, and/or more than 90%, of each complementary die (71, 72, 73, 74). In one embodiment, the area of a primary semiconductor die 80 may include the entirety of the area of a respective complementary die set 70.

Generally, each of the primary semiconductor dies 80 comprises at least one array of primary metal bump structures 806, and the at least one array of primary metal bump structures 806 is attached to the array(s) of solder portions 706 within a respective package area PA. Each array of solder portions 706 attached to the complementary dies (71, 72, 73, 74) may be bonded to the primary metal bump structures 806. Thus, the array of primary semiconductor dies 80 may be bonded to the array of complementary die sets 70. Each complementary die (71, 72, 73 74) may be bonded to a respective one of the primary semiconductor dies 80 through an array of metal bonding structures that comprises a rectangular array of solder balls (comprising solder portions 706) bonded to a respective mating pair of metal pads or a rectangular array of solder material portions bonded to a respective pair of copper pillar bumps.

A continuous primary-level molding compound layer 130 may be formed around the array of primary semiconductor dies 80 and over the continuous inter-mold underfill layer 120. For example, an epoxy molding compound (EMC) may be applied to the gaps between the primary semiconductor dies 80. The composition of the EMC may be selected from any material composition that may be used for the continuous complementary-level molding compound layer 110. The material compositions of the continuous complementary-level molding compound layer 110 and the continuous primary-level molding compound layer 130 may be the same, or may be different. In one embodiment, the continuous complementary-level molding compound layer 110 may be more rigid (i.e., have a higher Young's modulus) than the continuous primary-level molding compound layer 130.

Figure 3A:
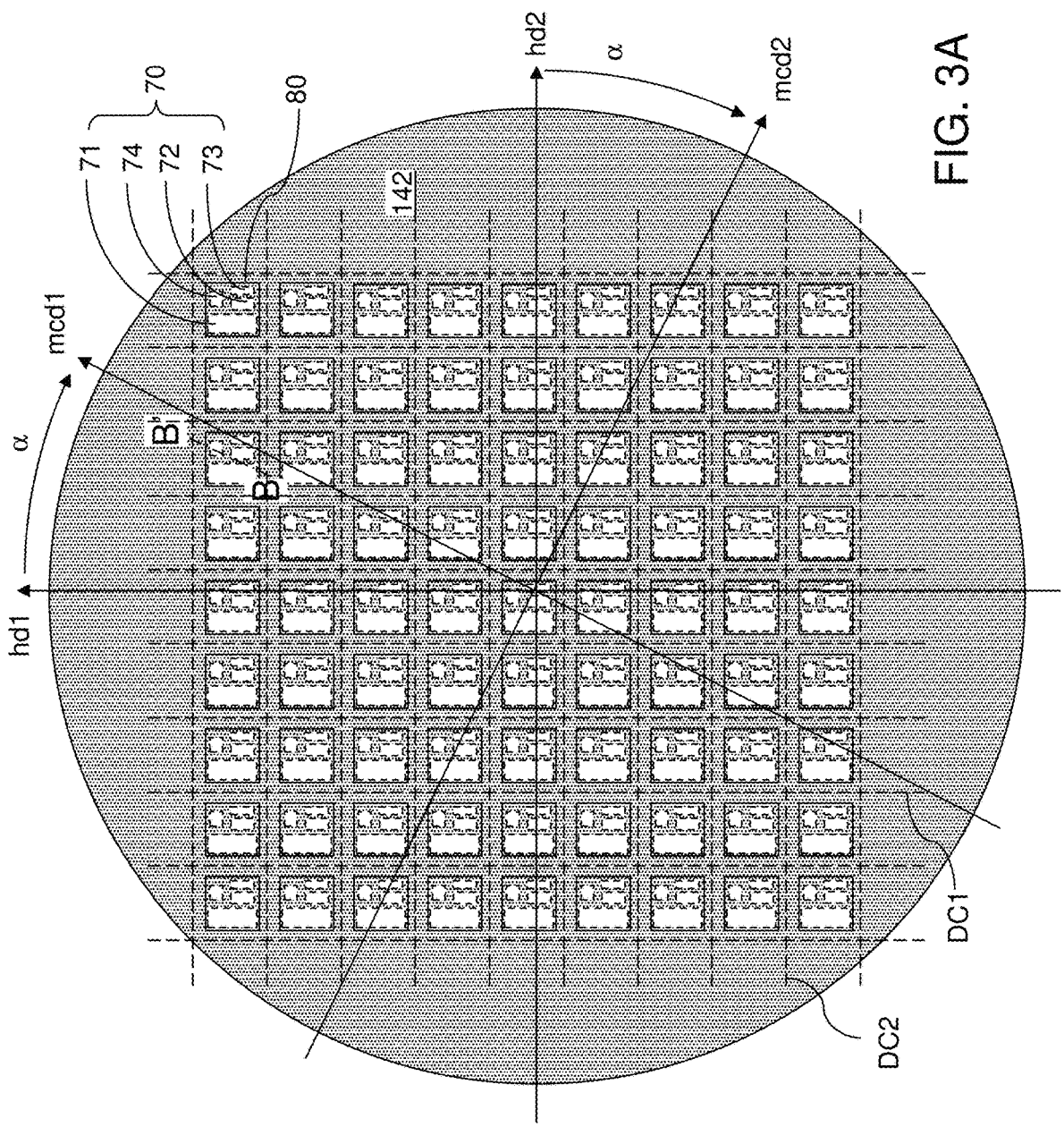
FIG. 3A is a top-down view of the first exemplary structure after forming a continuous primary-level molding compound layer according to the first embodiment of the present disclosure.
Figure 3B:
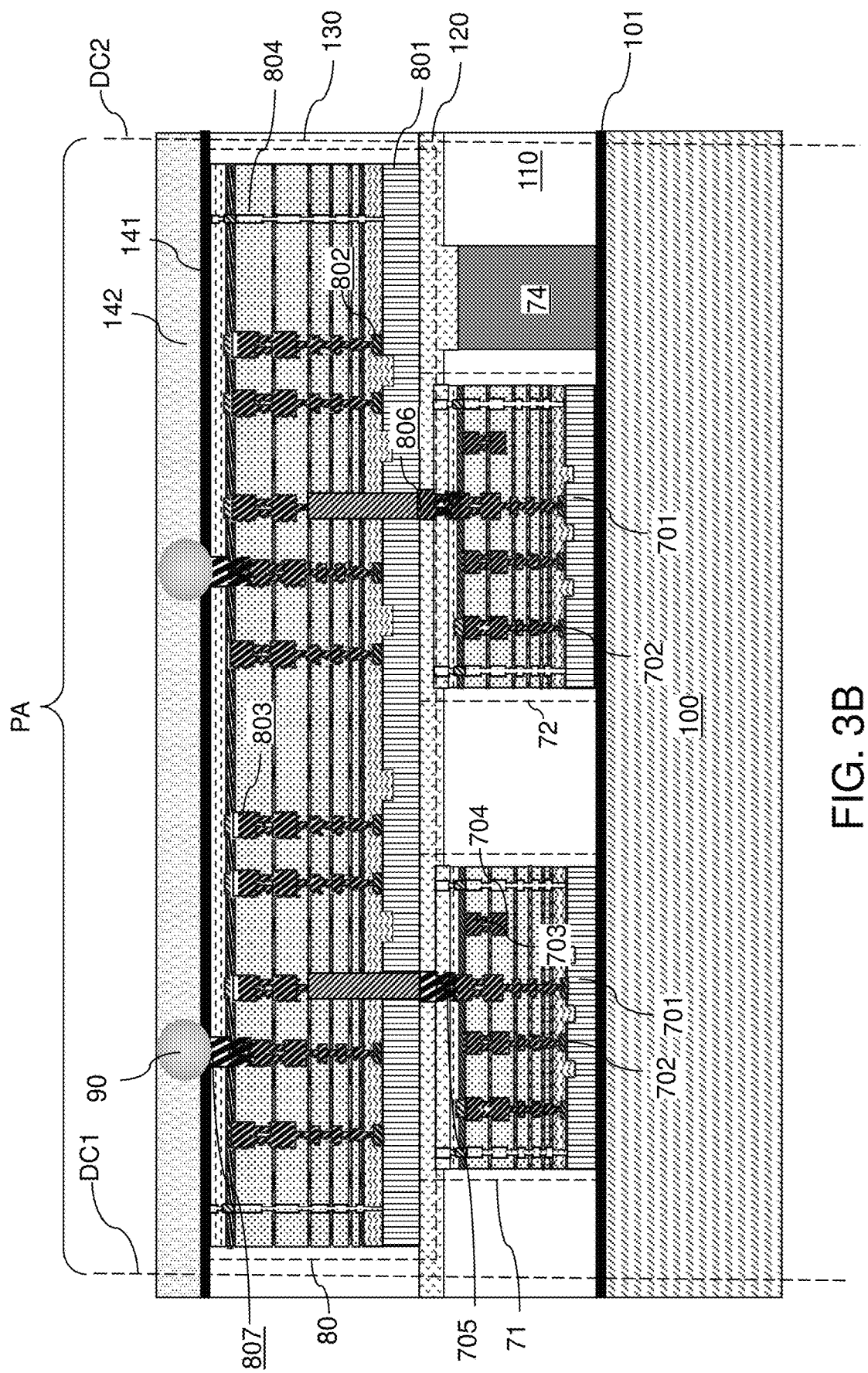
FIG. 3B a vertical cross-sectional view of the first exemplary structure along the vertical plane B-B' of FIG. 3A.

Referring to FIGS. 3A and 3B, a dielectric passivation layer 141, such as a silicon nitride layer or a polyimide layer, may be deposited over the primary-level molding compound layer 130. The thickness of the dielectric passivation layer 141 may be in a range from 100 nm to 5,000 nm, although lesser and greater thicknesses may also be used. The dielectric passivation layer 141 may be patterned to form openings, within which bonding pads 807 of the primary semiconductor dies 80 may be physically exposed. An array of solder balls, which is herein referred to an array of packaging-substrate-side solder balls 90, may be formed on each array of physically exposed bonding pads 807 of the primary semiconductor dies 80. An underfill material layer, which is herein referred to as a packaging-substrate-side underfill material layer 142, may be formed around the arrays of packaging-substrate-side solder balls 90.

The bonded assembly including the array of primary semiconductor dies 80, the continuous primary-level molding compound layer 130, the array of complementary die sets 70, the continuous complementary-level molding compound layer 110, and the carrier substrate 100 may be diced along first dicing channels DC1 that are parallel to the first horizontal direction hd1, and along second dicing channels DC2 that are parallel to the second horizontal direction hd2. The diced portion of the bonded assembly comprise a plurality of fan-out packages, i.e., a plurality of fan-out wafer-level packages (FOWLPs).

Figure 4:
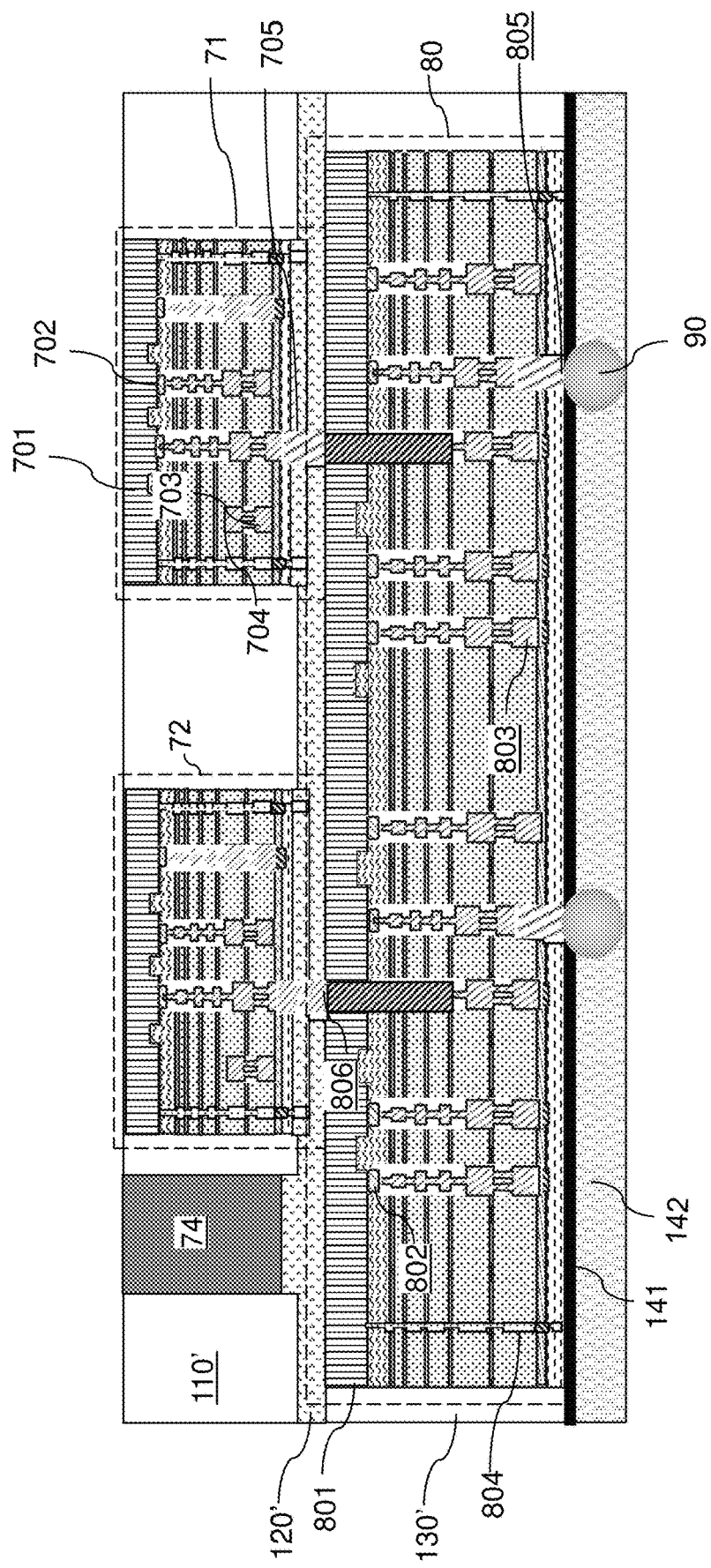
FIG. 4 is a vertical cross-sectional view of a first exemplary fan-out package obtained by dicing the first exemplary structure of FIGS. 3A and 3B.

Subsequently, diced portions of the carrier substrate 100 and the adhesion layer 101 may be removed from each of the fan-out wafer-level packages. A fan-out wafer-level package is illustrated in FIG. 4 after removal of the diced portions of the carrier substrate 100 and the adhesion layer 101. Subsequently, each fan-out wafer-level package may be attached to a packaging substrate (not illustrated) using the arrays of packaging-substrate-side solder balls 90.

Each diced portion of the continuous complementary-level molding compound layer 110 constitutes a complementary-level molding compound layer 110' that laterally surrounds a complementary die set 70. Each diced portion of the continuous primary-level molding compound layer 130 constitutes a primary-level molding compound layer 130' that laterally surrounds a primary semiconductor die 80.

Each diced portion of the continuous inter-mold underfill layer 120 constitutes an inter-mold underfill layer 120' that laterally surrounds at least one array of solder balls (comprising solder portions 706), which may be a plurality of arrays of solder balls. In one embodiment, sidewalls of the complementary-level molding compound layer 110', the inter-mold underfill layer 120', and the primary-level molding compound layer 130' may be vertically coincident, i.e., may be located within a same vertical plane.

Generally, the various in-plane major crystallographic directions of the carrier substrate 100 (in embodiments in which a single crystalline semiconductor material is present therein), the complementary semiconductor substrate(s) 701 of each complementary die (71, 72, 73, 74), and the primary semiconductor substrate 801 of the primary semiconductor die 80 within a fan-out wafer-level package may be azimuthally offset from the first horizontal direction hd1 and from the second horizontal direction hd2 by at least 0.5 degree, and/or at least 1.0 degrees, and/or at least 2 degrees, and/or at least 3 degrees, and/or at least 4 degrees, and/or at least 5 degrees, and/or at least 6 degrees, and/or at least 8 degrees, and/or at least 10 degrees. Further, the various in-plane major crystallographic directions of the carrier substrate 100 (in embodiments in which a single crystalline semiconductor material is present therein), the complementary semiconductor substrate(s) 701 of each complementary die (71, 72, 73, 74), and the primary semiconductor substrate 801 of the primary semiconductor die 80 within a fan-out wafer-level package may be azimuthally offset from one another at least 0.5 degree, and/or at least 1.0 degrees, and/or at least 2 degrees, and/or at least 3 degrees, and/or at least 4 degrees, and/or at least 5 degrees, and/or at least 6 degrees, and/or at least 8 degrees, and/or at least 10 degrees.

Figure 5A:
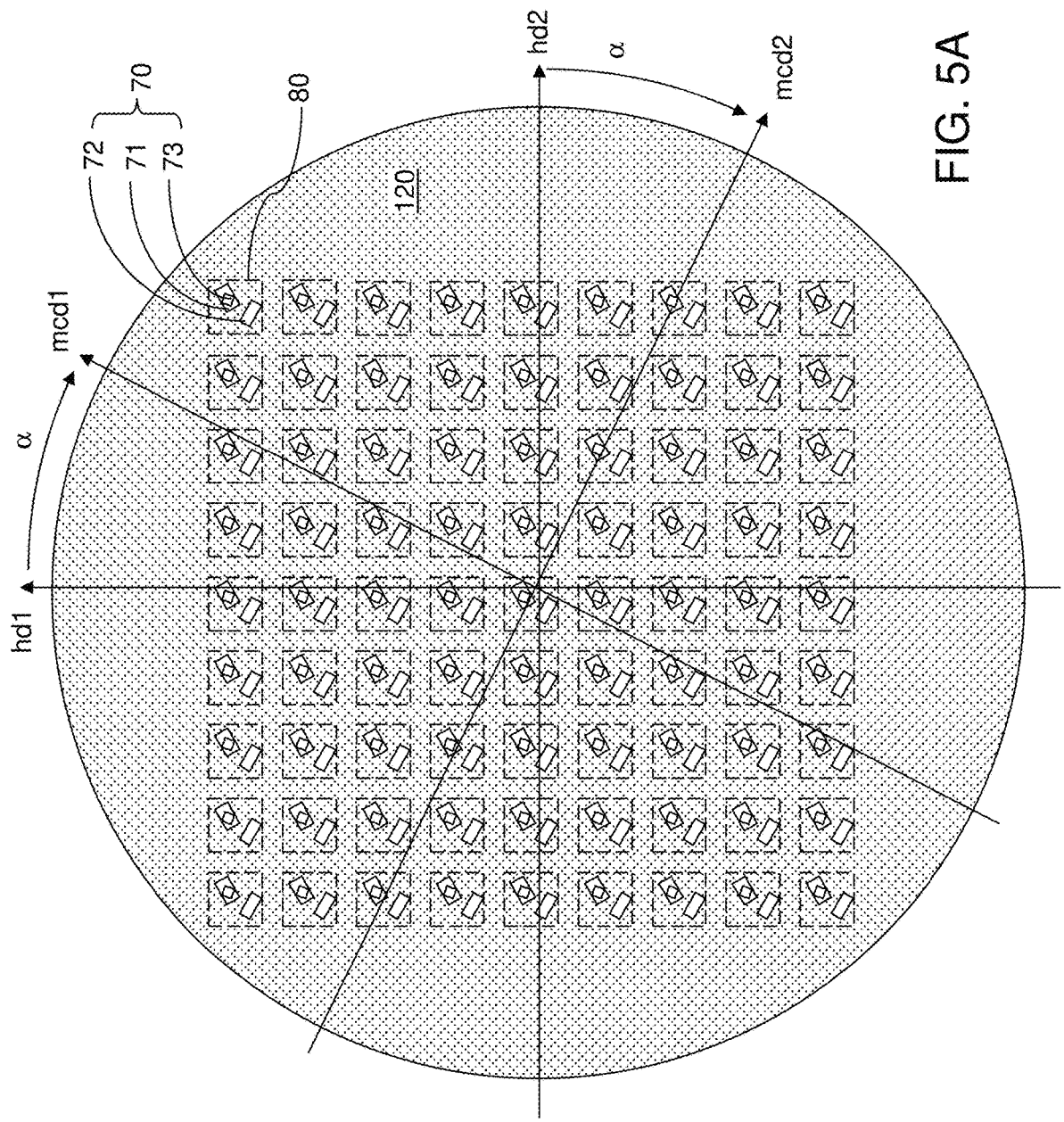
FIG. 5A is a top-down view of a second exemplary structure after attaching an array of complementary die sets to a carrier substrate according to a second embodiment of the present disclosure.
Figure 5B:
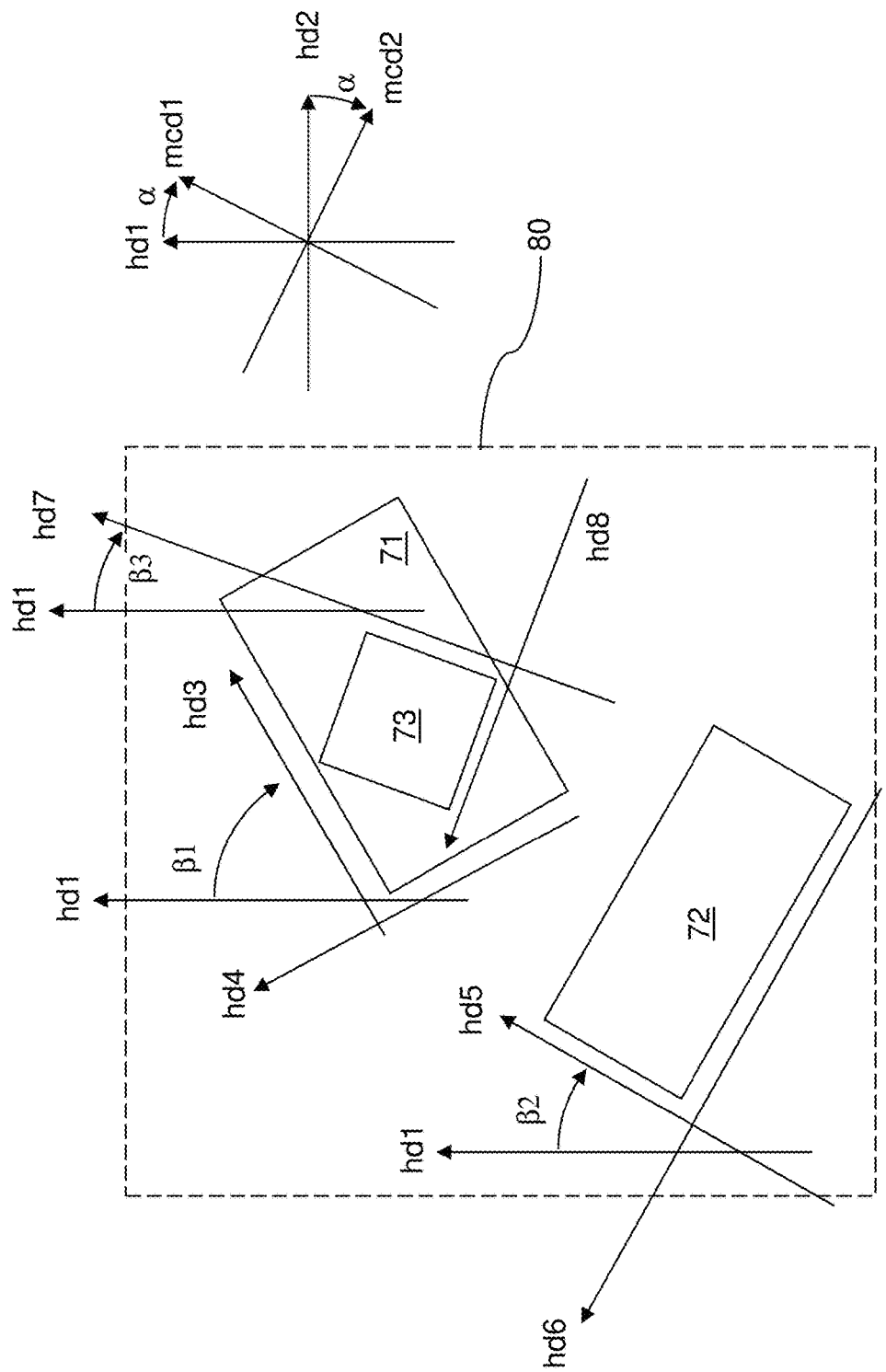
FIG. 5B is a magnified view of a package area in the second exemplary structure along the vertical plane B-B' of FIG. 5A.

Referring to FIGS. 5A and 5B, a second exemplary structure according to a second embodiment of the present disclosure may be derived from the first exemplary structure illustrated in FIGS. 1A and 1B by tilting sidewalls of at least one complement die (71, 72, 73) within each complementary die set 70 so that lengthwise sidewalls and widthwise sidewalls of the at least one complementary die (71, 72, 73) are not parallel to the first horizontal direction hd1 and are not parallel to the second horizontal direction hd2. In other words, the sidewalls of at least one complement die (71, 72, 73) within each complementary die set 70 are tilted such that lengthwise sidewalls and widthwise sidewalls of the at least one complementary die (71, 72, 73) are not parallel to the directions of periodicity within the array of complementary die sets 70.

In one embodiment, upon attaching an array of complementary die sets 70 to a carrier substrate 100, the array of complementary die sets 70 has a first periodicity along the first horizontal direction hd1 and has a second periodicity along the second horizontal direction hd2 that is perpendicular to the first horizontal direction hd1. Each complementary die set 70 comprises a first complementary die 71 that has a first pair of complementary-die sidewalls laterally extending along a third horizontal direction hd3 that is not parallel to the first horizontal direction hd1 or the second horizontal direction hd2, and has a second pair of complementary-die sidewalls laterally extending along a fourth horizontal direction hd4 that is perpendicular to the third horizontal direction hd3. The angle by which the first pair of complementary-die sidewalls of the first complementary die 71 is azimuthally offset from the first horizontal direction hd1 is herein referred to as a first complementary die azimuthal rotation angle b1, and is greater than 0 degrees and is less than 90 degrees, and may be in a range from 0.5 degree to 89.5 degrees, such as from 1 degrees to 89 degrees, and/or from 3 degrees to 87 degrees, and/or from 5 degrees to 85 degrees, and/or from 10 degrees to 80 degrees.

In one embodiment, each complementary die set 70 may comprise a second complementary die 72 that has a third pair of complementary-die sidewalls laterally extending along a fifth horizontal direction hd5 that is not parallel to the first horizontal direction hd1, the second horizontal direction hd2, the third horizontal direction hd3, or the fourth horizontal direction hd4, and has a fourth pair of complementary-die sidewalls laterally extending along a sixth horizontal direction hd6 that is perpendicular to the fifth horizontal direction hd5. The angle by which the third pair of complementary-die sidewalls of the second complementary die 72 is azimuthally offset from the first horizontal direction hd1 is herein referred to as a second complementary die azimuthal rotation angle b2, and is greater than 0 degrees and is less than 90 degrees, and may be in a range from 0.5 degree to 89.5 degrees, such as from 1 degrees to 89 degrees, and/or from 3 degrees to 87 degrees, and/or from 5 degrees to 85 degrees, and/or from 10 degrees to 80 degrees.

In one embodiment, each complementary die set 70 may comprise a third complementary die 73 that has a fifth pair of complementary-die sidewalls laterally extending along a seventh horizontal direction hd7 that is not parallel to the first horizontal direction hd1 or the second horizontal direction hd2, and has a sixth pair of complementary-die sidewalls laterally extending along an eighth horizontal direction hd8 that is perpendicular to the seventh horizontal direction hd7. The angle by which the fifth pair of complementary-die sidewalls of the third complementary die 73 is azimuthally offset from the first horizontal direction hd1 is herein referred to as a third complementary die azimuthal rotation angle β3, and is greater than 0 degrees and is less than 90 degrees, and may be in a range from 0.5 degree to 89.5 degrees, such as from 1 degrees to 89 degrees, and/or from 3 degrees to 87 degrees, and/or from 5 degrees to 85 degrees, and/or from 10 degrees to 80 degrees.

In one embodiment, the first complementary die azimuthal rotation angle β1, the second complementary die azimuthal rotation angle β2, and the third complementary die azimuthal rotation angle β3 may differ from one another at least by 0.5 degree.

In one embodiment, the area of a primary semiconductor die 80 may have an areal overlap with a predominant fraction (i.e., more than 50%) of each complementary die (71, 72, 73). In one embodiment, the area of a primary semiconductor die 80 may have an areal overlap with more than 80%, and/or more than 90%, of each complementary die (71, 72, 73). In one embodiment, the area of a primary semiconductor die 80 (to be subsequently bonded to a respective complementary die set 70 and is illustrated with a dotted line) may include the entirety of the area of a respective complementary die set 70. In other words, the entire area of each complementary die (71, 72, 73) overlaps within an area of the primary semiconductor die 80 to be subsequently bonded in a plan view (i.e., a view along the vertical direction).

In one embodiment, each complementary die (71, 72, 73) may be laterally spaced apart without areal overlap thereamongst. Alternatively, one or more sets of at least two complementary dies (71, 72, 73) may be vertically stacked.

As a structure derived from the first exemplary structure, the second exemplary structure may include any, each, and/or all features of the first exemplary structure of FIGS. 1A and 1B other than alignment of sidewalls of the complementary dies (71, 72, 73) along the first horizontal direction hd1 or along the second horizontal direction hd2 within the first exemplary structure of FIGS. 1A and 1B.

In one embodiment, the carrier substrate 100 may be a single crystalline semiconductor carrier substrate, and each of major in-plane crystallographic directions within the single crystalline semiconductor carrier substrate may be azimuthally offset from the first horizontal direction hd1 and from the second horizontal direction hd2 by at least 0.5 degree.

As discussed above and illustrated in FIG. 1B, each of the complementary dies (71, 72, 73) may comprise a respective array of complementary metal bump structures 705. For example, if a complementary die set 70 includes a first complementary die 71, a second complementary die 72, and a third complementary die 73, etc., each of the first complementary dies 71 comprises a respective first array of complementary metal bump structures 705, each of the second complementary dies 72 comprises a respective second array of complementary metal bump structures 705, each of the third complementary dies 73 comprises a respective third array of complementary metal bump structures 705, etc. Each array of complementary metal bump structures 705 may comprise an array of metal pads or an array of copper pillar bumps.

In one embodiment, at least one, or each, of the complementary dies (71, 72, 73) may comprise a rectangular periodic array of complementary metal bump structures 705 that are arranged with a respective first periodicity along a horizontal direction extending along the lengthwise sidewalls of a respective complementary die (71, 72, 73) and arranged with a respective second periodicity along another horizontal direction extending along the widthwise sidewalls of the respective complementary die (71, 72, 73). Within the second exemplary structure illustrated in FIGS. 5A and 5B, each lengthwise sidewall and each widthwise sidewall of the complementary dies (71, 72, 73) may be independently azimuthally tiled relative to the first horizontal direction hd1 and the second horizontal direction hd2. Thus, rectangular periodic array of complementary metal bump structures 705 of each complementary die (71, 72, 73) may have a periodicity along respective horizontal directions that are tilted from the first horizontal direction hd1 and from the second horizontal direction hd2 by a respective non-orthogonal angle.

For example, each of the first complementary dies 71 comprises a respective first array of complementary metal bump structures 705, which may be a rectangular array having a bump periodicity along the third horizontal direction hd3 and another bump periodicity along the fourth horizontal direction hd4. Each of the second complementary dies 72 comprises a respective second array of complementary metal bump structures 705, which may be a rectangular array having a bump periodicity along the fifth horizontal direction hd5 and another bump periodicity along the sixth horizontal direction hd6. Each of the third complementary dies 73 comprises a respective third array of complementary metal bump structures 705, which may be a rectangular array having a bump periodicity along the seventh horizontal direction hd7 and another bump periodicity along the eighth horizontal direction hd8. In some embodiments, a complementary die (e.g., the third complementary die 73) may be bonded to another complementary die (e.g., the first complementary die 71) through a respective array of complementary metal bump structures (not shown), an array of solder portions (not shown), and an array of mating metal bump structures (not shown) of the other semiconductor die.

An array of solder portions 706 may be formed on each array of complementary metal bump structures 705. A continuous underfill layer, which is herein referred to as a continuous inter-mold underfill layer 120, may be formed around the array of solder portions 706 and over the continuous complementary-level molding compound layer 110.

Figure 6B:
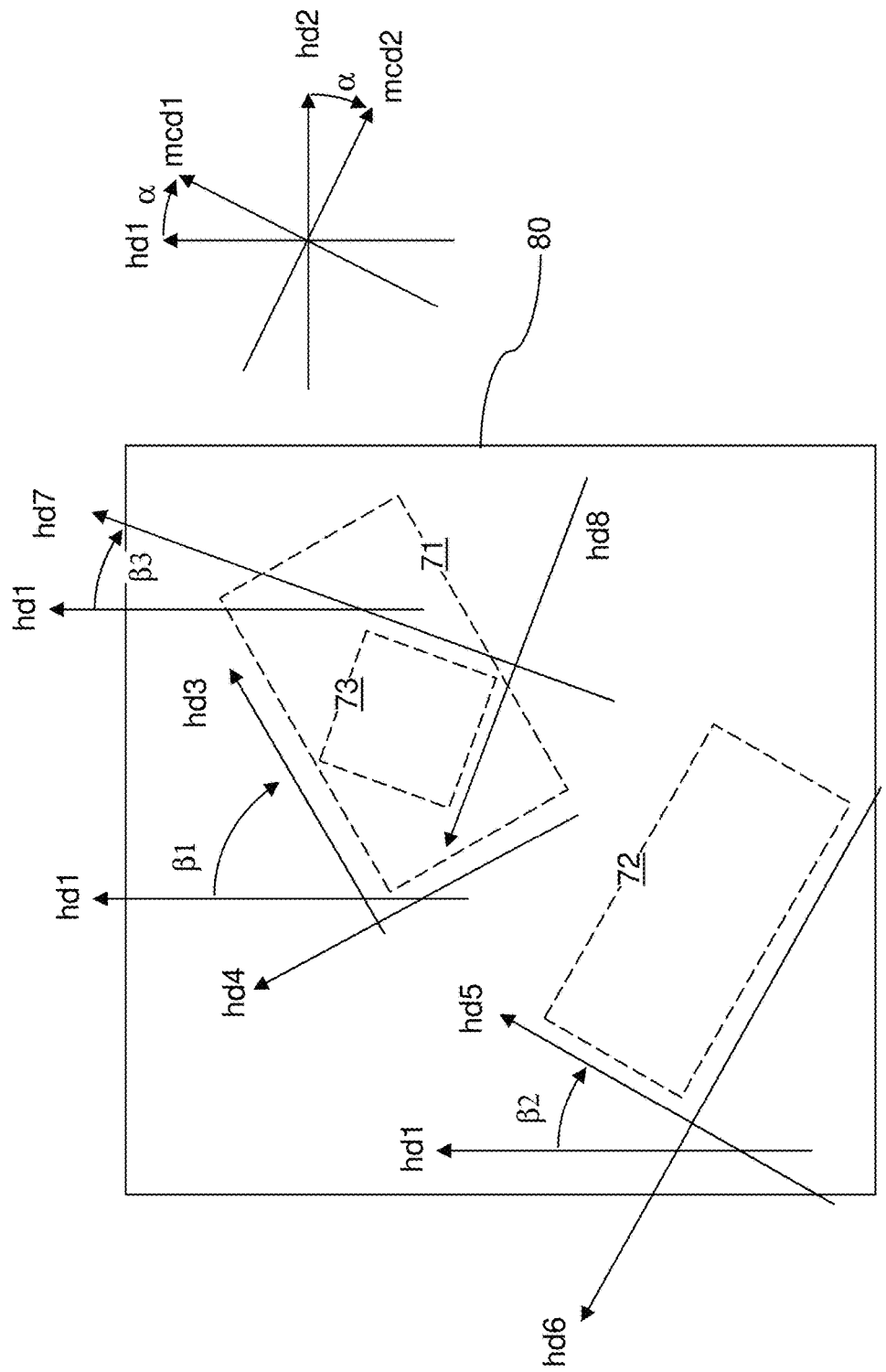
FIG. 6B is a magnified view of a package area in the second exemplary structure along the vertical plane B-B' of FIG. 6A.

Referring to FIGS. 6A and 6B, an array of primary semiconductor dies 80 may be attached to the array of complementary die sets 70. In one embodiment, the primary semiconductor die 80 of the present disclosure may comprise a system-on-chip (SoC) die. Each primary semiconductor die 80 may include a set of components illustrated in FIG. 2B and described above. At least one set of primary metal bump structures 806 may be attached to the through-substrate via structures 805.

According to an aspect of the present disclosure, each set of primary metal bump structures 806 may be arranged with the same tilt angle with respective to the first horizontal direction hd1 and with respect to the second horizontal direction hd2, and with the same periodicity, as a mating array of complementary metal bump structures 705. The number of sets of primary metal bump structures 806 in each primary semiconductor die 80 may be the same as the total number of complementary dies (71, 72, 73) that are subsequently directly attached to the primary semiconductor die 80. In one embodiment, at least one array of primary metal bump structures 806 may be a respective rectangular array having a respective first direction of periodicity along the horizontal direction of lengthwise sidewalls of a respective complementary die (71, 72, 73) and having a respective second direction of periodicity along the horizontal direction of widthwise sidewalls of the respective complementary die (71, 72, 73).

In one embodiment, the area of a primary semiconductor die 80 may have an areal overlap with a predominant fraction (i.e., more than 50%) of each complementary die (71, 72, 73). In one embodiment, the area of a primary semiconductor die 80 may have an areal overlap with more than 80%, and/or more than 90%, of each complementary die (71, 72, 73). In one embodiment, the area of a primary semiconductor die 80 may include the entirety of the area of a respective complementary die set 70.

Generally, each of the primary semiconductor dies 80 comprises at least one array of primary metal bump structures 806, and the at least one array of primary metal bump structures 806 is attached to the array(s) of solder portions 706 within a respective package area PA. Each array of solder portions 706 attached to the complementary dies (71, 72, 73) may be bonded to the primary metal bump structures 806. Thus, the array of primary semiconductor dies 80 may be bonded to the array of complementary die sets 70. Each complementary die (71, 72, 73) may be bonded to a respective one of the primary semiconductor dies 80 through an array of metal bonding structures that comprises a rectangular array of solder balls (comprising solder portions 706) bonded to a respective mating pair of metal pads or a rectangular array of solder material portions bonded to a respective pair of copper pillar bumps.

In one embodiment, each of the primary semiconductor dies 80 within the rectangular array of primary semiconductor dies 80 may comprise a first pair of primary-die sidewalls that are parallel to the first horizontal direction hd1 and a second pair of primary-die sidewalls that are parallel to the second horizontal direction hd2. In one embodiment, a plurality of complementary dies (71, 72, 73) including a first complementary die 71 and a second complementary die 72 may be attached to a primary semiconductor die 80. In one embodiment, each first complementary die 71 may be bonded to a respective one of the primary semiconductor dies 80 through an array of metal bonding structures that comprises a rectangular array of solder balls (comprising solder portions 706) bonded to a respective mating pair of metal pads, or a rectangular array of solder material portions (comprising solder portions 706) bonded to a respective pair of copper pillar bumps. Each rectangular array of solder balls or solder material portions used to attach the first complementary die 71 to the primary semiconductor die 80 has a bump periodicity along the third horizontal direction hd3 and an additional bump periodicity along the fourth horizontal direction hd4.

Each second complementary die 72 may be bonded to the respective one of the primary semiconductor dies 80 through an array of metal bonding structures that comprises a rectangular array of solder balls (comprising solder portions 706) bonded to a respective mating pair of metal pads, or a rectangular array of solder material portions (comprising solder portions 706) bonded to a respective pair of copper pillar bumps. Each rectangular array of solder balls or solder material portions used to attach the second complementary die 72 to the primary semiconductor die 80 has a bump periodicity along the fifth horizontal direction hd5 and an additional bump periodicity along the sixth horizontal direction hd6.

A continuous primary-level molding compound layer 130 may be formed around the array of primary semiconductor dies 80 and over the continuous inter-mold underfill layer 120. For example, an epoxy molding compound (EMC) may be applied to the gaps between the primary semiconductor dies 80. The composition of the EMC may be selected from any material composition that may be used for the continuous complementary-level molding compound layer 110. The material compositions of the continuous complementary-level molding compound layer 110 and the continuous primary-level molding compound layer 130 may be the same, or may be different. In one embodiment, the continuous complementary-level molding compound layer 110 may be more rigid (i.e., have a higher Young's modulus) than the continuous primary-level molding compound layer 130.

Figure 7:
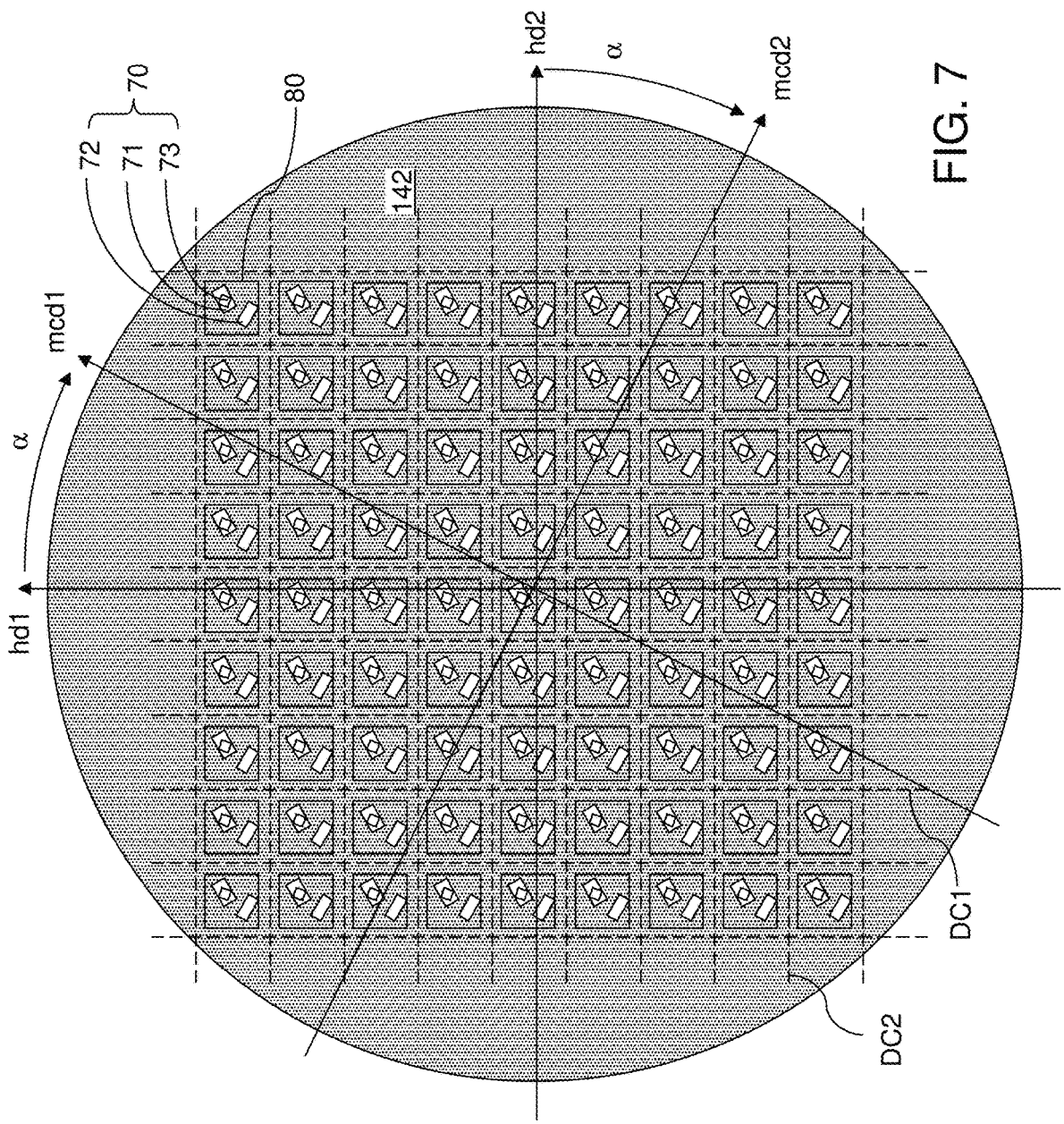
FIG. 7 is a top-down view of the second exemplary structure after forming a continuous primary-level molding compound layer according to the second embodiment of the present disclosure.

Referring to FIG. 7, a dielectric passivation layer 141, an array of packaging-substrate-side solder balls 90, and a packaging-substrate-side underfill material layer 142 (which are illustrated in FIG. 3B) may be formed.

The bonded assembly including the array of primary semiconductor dies 80, the continuous primary-level molding compound layer 130, the array of complementary die sets 70, the continuous complementary-level molding compound layer 110, and the carrier substrate 100 may be diced along first dicing channels DC1 that are parallel to the first horizontal direction hd1, and along second dicing channels DC2 that are parallel to the second horizontal direction hd2. The diced portion of the bonded assembly comprise a plurality of fan-out packages, i.e., a plurality of fan-out wafer-level packages (FOWLPs).

Figure 8:
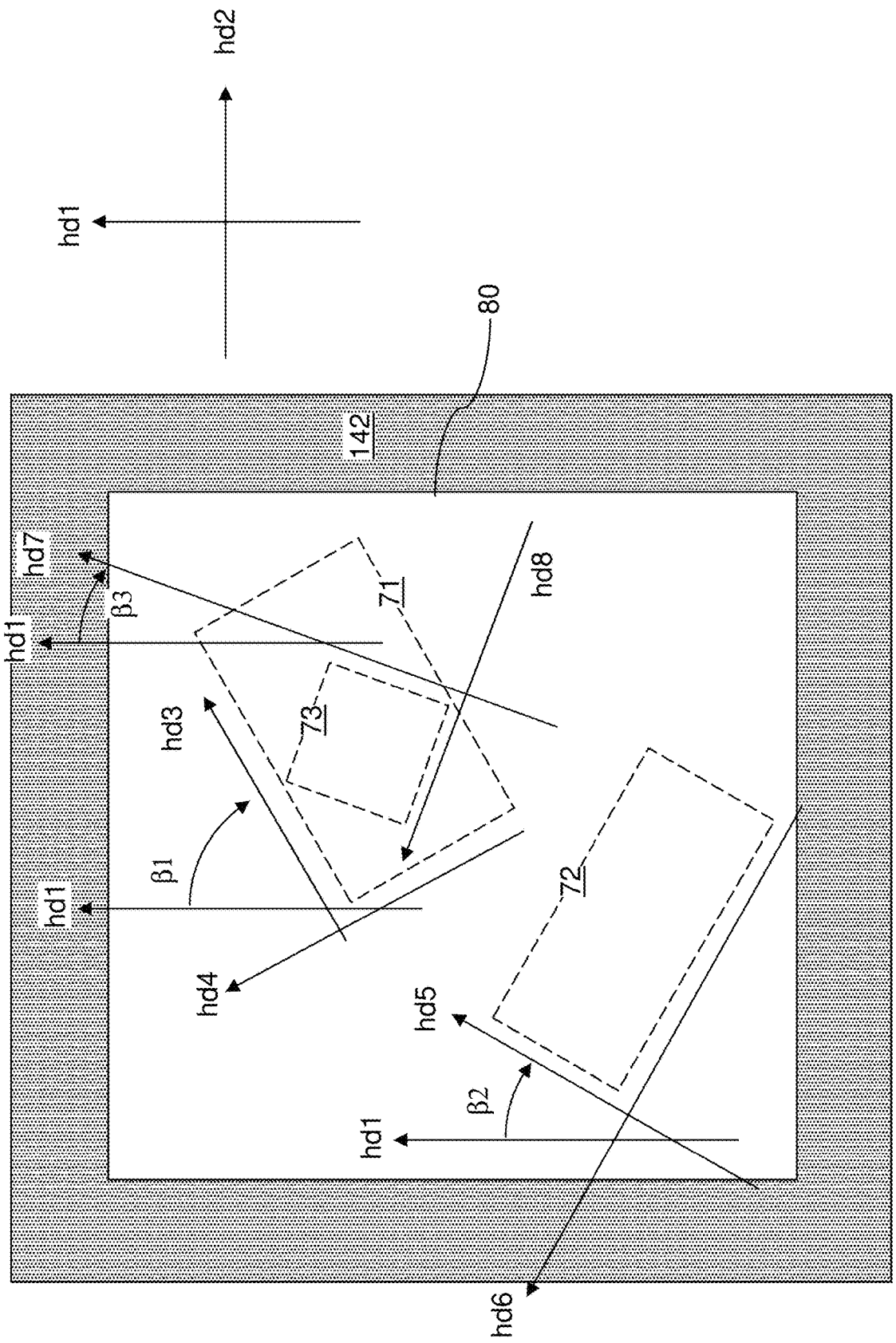
FIG. 8 is a bottom-up view of a fan-out package obtained by dicing the second exemplary structure of FIG. 7.

Subsequently, diced portions of the carrier substrate 100 and the adhesion layer 101 may be removed from each of the fan-out wafer-level packages. A fan-out wafer-level package is illustrated in FIG. 8 after removal of the diced portions of the carrier substrate 100 and the adhesion layer 101. Subsequently, each fan-out wafer-level package may be attached to a packaging substrate (not illustrated) using the arrays of packaging-substrate-side solder balls 90.

As illustrated in FIG. 4, each diced portion of the continuous complementary-level molding compound layer 110 constitutes a complementary-level molding compound layer 110' that laterally surrounds a complementary die set 70. Each diced portion of the continuous primary-level molding compound layer 130 constitutes a primary-level molding compound layer 130' that laterally surrounds a primary semiconductor die 80. Each diced portion of the continuous inter-mold underfill layer 120 constitutes an inter-mold underfill layer 120' that laterally surrounds at least one array of solder balls (comprising solder portions 706), which may be a plurality of arrays of solder balls. In one embodiment, sidewalls of the complementary-level molding compound layer 110', the inter-mold underfill layer 120', and the primary-level molding compound layer 130' may be vertically coincident, i.e., may be located within a same vertical plane.

Generally, the various in-plane major crystallographic directions of the carrier substrate 100 (in embodiments in which a single crystalline semiconductor material is present therein), the complementary semiconductor substrate(s) 701 of each complementary die (71, 72, 73, 74), and the primary semiconductor substrate 801 of the primary semiconductor die 80 within a fan-out wafer-level package may be azimuthally offset from the first horizontal direction hd1 and from the second horizontal direction hd2 by at least 0.5 degree, and/or at least 1.0 degrees, and/or at least 2 degrees, and/or at least 3 degrees, and/or at least 4 degrees, and/or at least 5 degrees, and/or at least 6 degrees, and/or at least 8 degrees, and/or at least 10 degrees. Further, the various in-plane major crystallographic directions of the carrier substrate 100 (in embodiments in which a single crystalline semiconductor material is present therein), the complementary semiconductor substrate(s) 701 of each complementary die (71, 72, 73, 74), and the primary semiconductor substrate 801 of the primary semiconductor die 80 within a fan-out wafer-level package may be azimuthally offset from one another at least 0.5 degree, and/or at least 1.0 degrees, and/or at least 2 degrees, and/or at least 3 degrees, and/or at least 4 degrees, and/or at least 5 degrees, and/or at least 6 degrees, and/or at least 8 degrees, and/or at least 10 degrees.

Figure 9A:
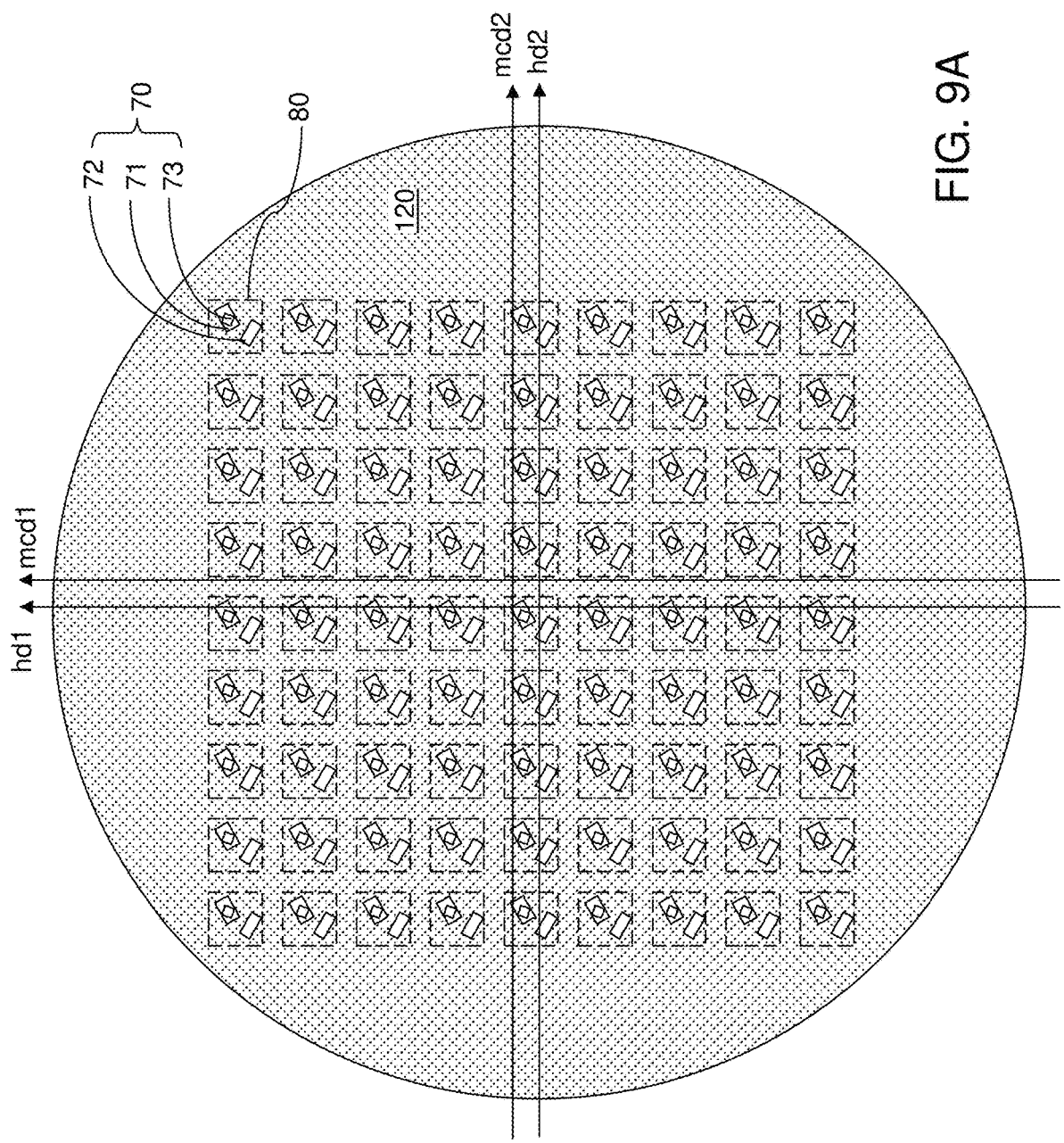
FIG. 9A is a top-down view of a third exemplary structure after attaching an array of complementary die sets to a carrier substrate according to a third embodiment of the present disclosure.
Figure 9B:
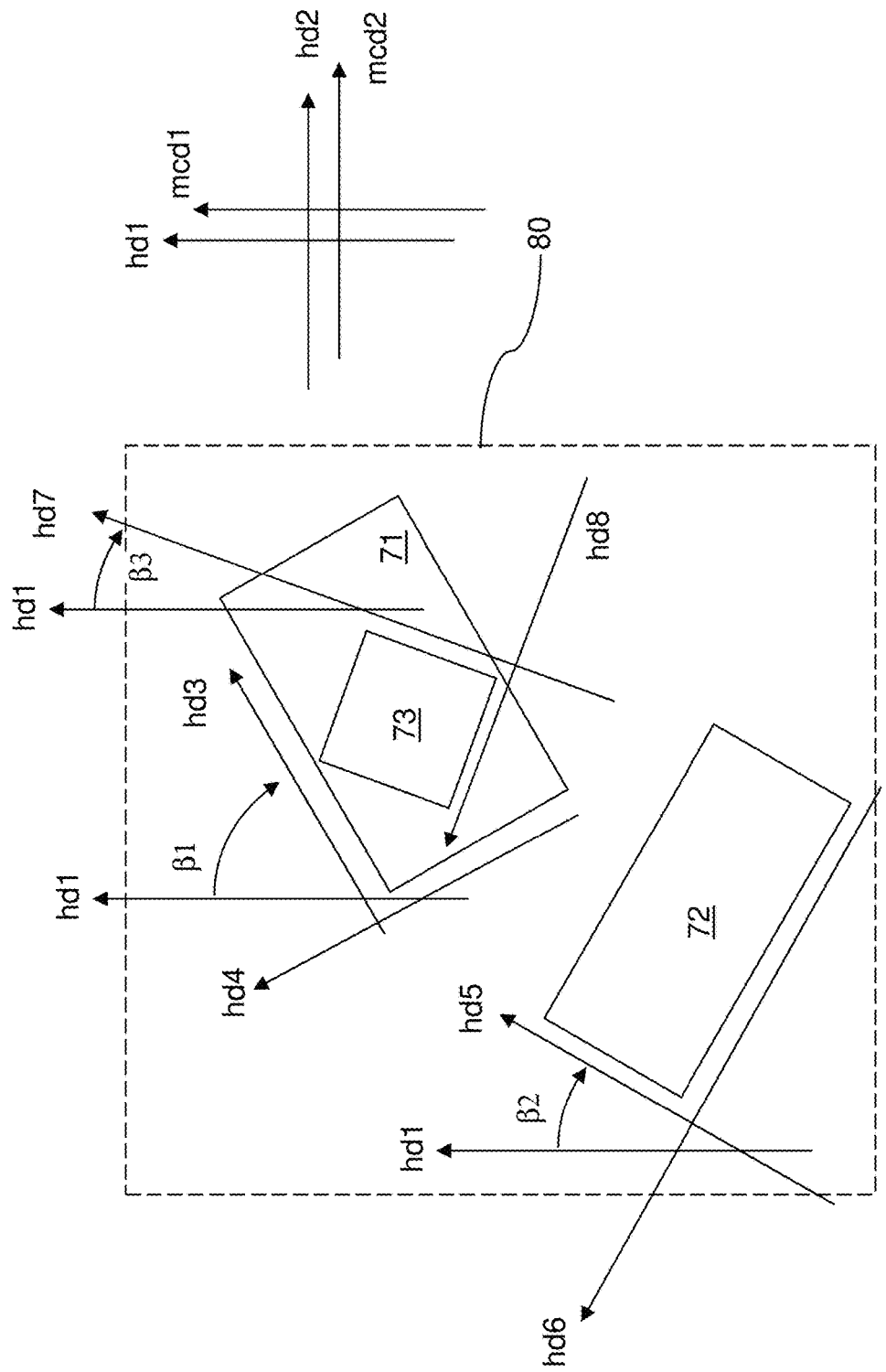
FIG. 9B is a magnified view of a package area in the third exemplary structure along the vertical plane B-B' of FIG. 9A.

Referring to FIGS. 9A and 9B, a third exemplary structure according to a third embodiment of the present disclosure may be derived from the second exemplary structure of FIGS. 5A and 5B by reducing the azimuthal offset angle a within the second exemplary structure of FIGS. 5A and 5B to zero, or by using a carrier substrate 100 that does not have any major in-plane crystallographic directions such as a carrier substrate comprising an amorphous material (such as silicon oxide or a polymer material). Other than a change in the azimuthal offset angle a to zero or replacement of a crystalline substrate material with an amorphous substrate material for the carrier substrate 100, the third exemplary structure may have the same features as the second exemplary structure of FIGS. 5A and 5B.

Figure 10:
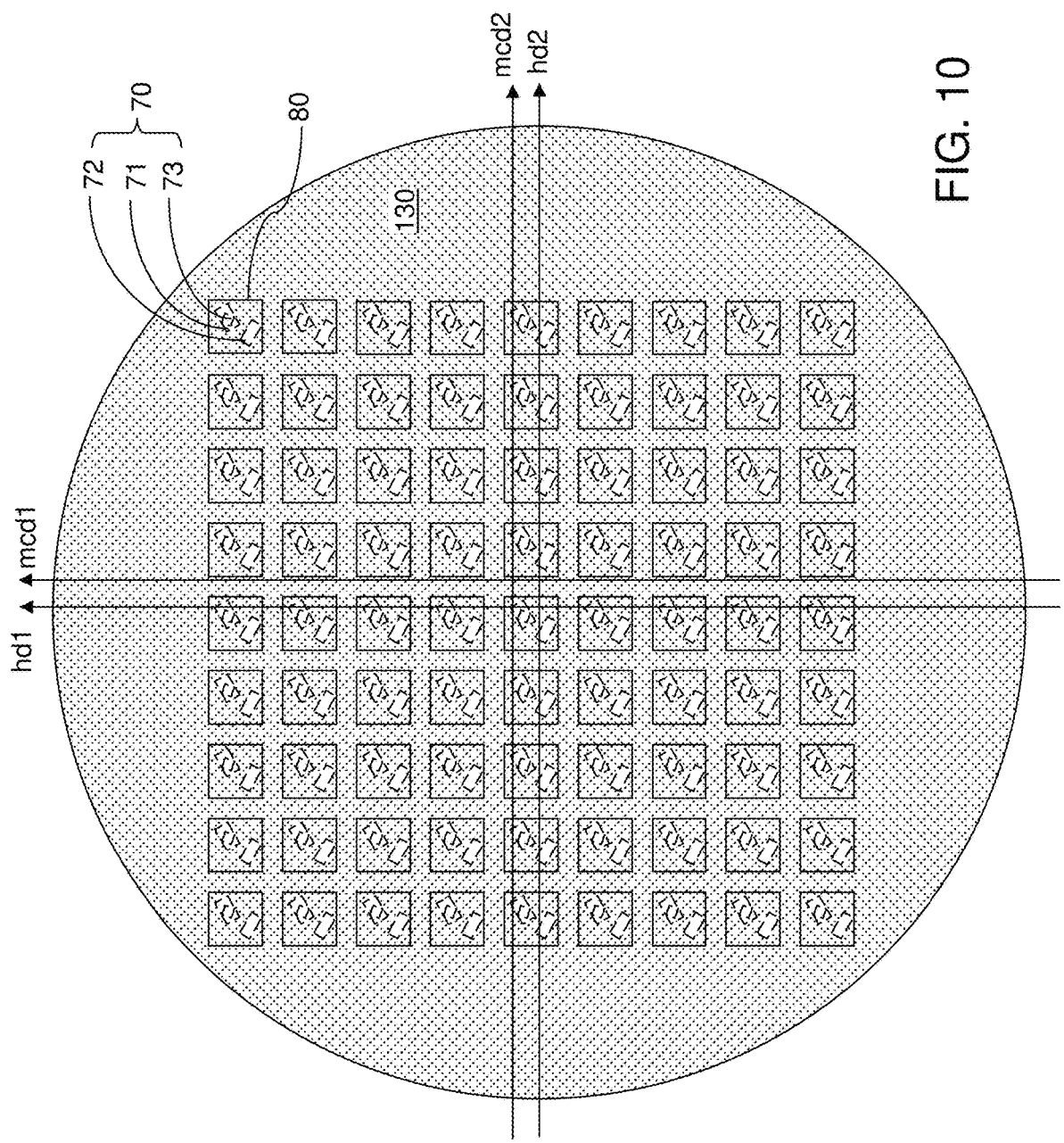
FIG. 10 is a top-down view of the third exemplary structure after attaching an array of primary semiconductor dies to the array of complementary die sets according to the third embodiment of the present disclosure.

Referring to FIG. 10, the processing steps of FIGS. 6A and 6B may be performed to attach a periodic array of primary semiconductor dies 80 having a first periodicity along the first horizontal direction hd1 and having a second periodicity along the second horizontal direction hd2. The periodic array of complementary die sets 70 and the periodic array of primary semiconductor dies 80 have the same periodicity.

A continuous primary-level molding compound layer 130 may be formed around the array of primary semiconductor dies 80 and over the continuous inter-mold underfill layer 120. The material compositions of the continuous complementary-level molding compound layer 110 and the continuous primary-level molding compound layer 130 may be the same, or may be different. In one embodiment, the continuous complementary-level molding compound layer 110 may be more rigid (i.e., have a higher Young's modulus) than the continuous primary-level molding compound layer 130.

Figure 11:
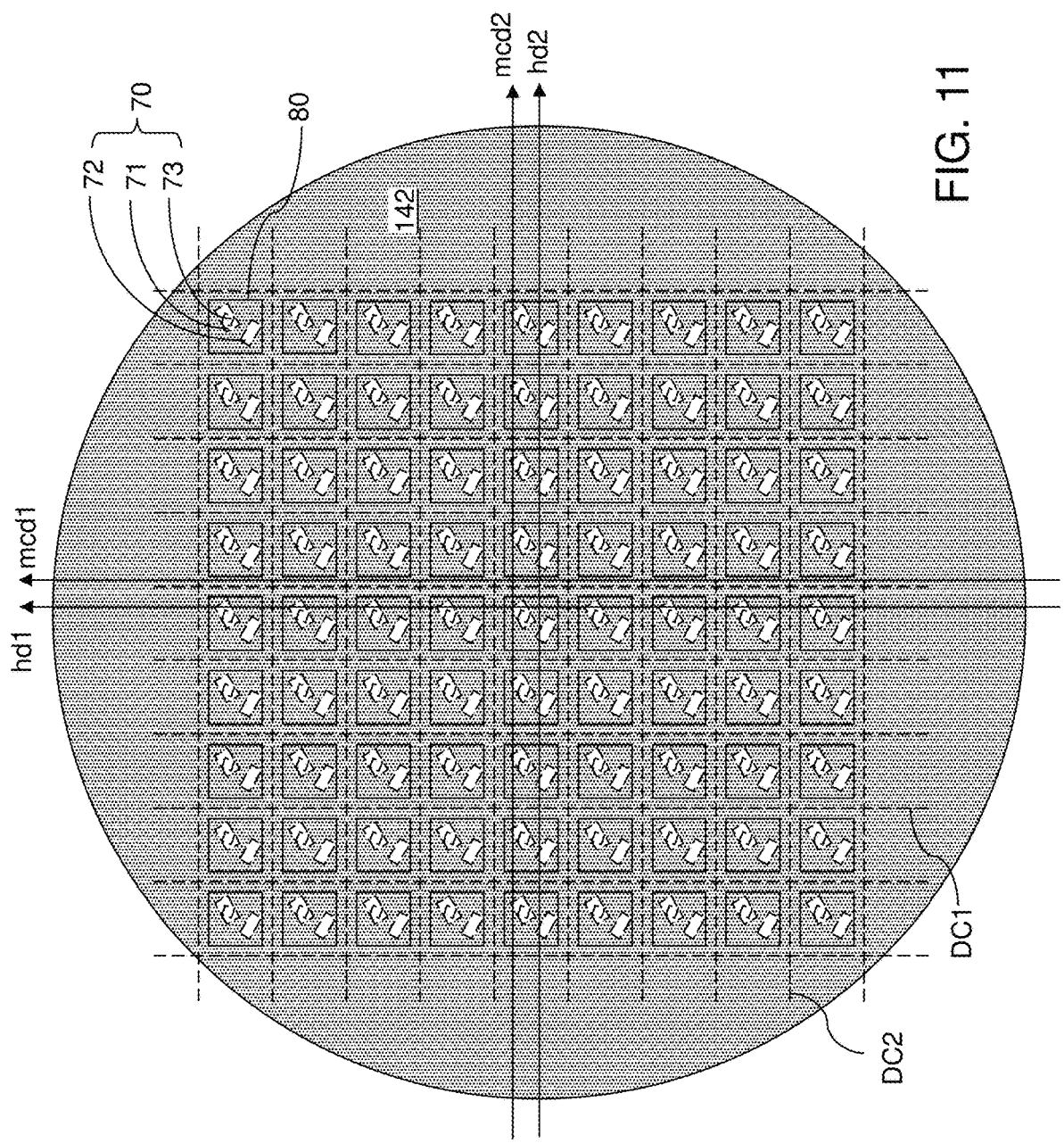
FIG. 11 is a top-down view of the third exemplary structure after forming a continuous primary-level molding compound layer according to the third embodiment of the present disclosure.

Referring to FIG. 11, a dielectric passivation layer 141, an array of packaging-substrate-side solder balls 90, and a packaging-substrate-side underfill material layer 142 (which are illustrated in FIG. 3B) may be formed.

The bonded assembly including the array of primary semiconductor dies 80, the continuous primary-level molding compound layer 130, the array of complementary die sets 70, the continuous complementary-level molding compound layer 110, and the carrier substrate 100 may be diced along first dicing channels DC1 that are parallel to the first horizontal direction hd1, and along second dicing channels DC2 that are parallel to the second horizontal direction hd2. The diced portion of the bonded assembly comprise a plurality of fan-out packages, i.e., a plurality of fan-out wafer-level packages (FOWLPs).

Subsequently, diced portions of the carrier substrate 100 and the adhesion layer 101 may be removed from each of the fan-out wafer-level packages. A fan-out wafer-level package is illustrated in FIG. 8 after removal of the diced portions of the carrier substrate 100 and the adhesion layer 101. Subsequently, each fan-out wafer-level package may be attached to a packaging substrate (not illustrated) using the arrays of packaging-substrate-side solder balls 90.

Referring collectively to FIGS. 1A-11, a fan-out package is provided, which may include a primary semiconductor die 80 that includes a primary single crystalline semiconductor substrate having a <100> crystallographic direction along a first crystallographic lattice direction and may be laterally surrounded by a primary-level molding compound layer 130', wherein the primary semiconductor die 80 may include a first pair of primary-die sidewalls that are parallel to a first horizontal direction hd1 and a second pair of primary-die sidewalls that are parallel to a second horizontal direction hd2 and perpendicular to the first horizontal direction hd1; and a first complementary die 71 that overlies or underlies, and is bonded to, the primary semiconductor die 80, may be laterally surrounded by a complementary-level molding compound layer 110', and may include a first pair of complementary-die sidewalls laterally extending along a third horizontal direction hd3 and includes a second pair of complementary-die sidewalls laterally extending along a fourth horizontal direction hd4 that is perpendicular to the first pair of complementary-die sidewalls. The primary semiconductor die 80 may include a primary single crystalline semiconductor substrate (as embodied as a primary semiconductor substrate 801) having a <100> crystallographic direction along a first crystallographic lattice direction. The first complementary die 71 may include a complementary single crystalline semiconductor substrate (comprising a complementary semiconductor substrates 701) having a <100> crystallographic direction along a second crystallographic lattice direction. According to an aspect of the present disclosure, the fan-out package comprises at least one feature selected from: a first feature that the third horizontal direction hd3 is not parallel to the first horizontal direction hd1 or the second horizontal direction hd2; a second feature that the first crystallographic lattice direction is azimuthally offset from the first horizontal direction hd1 and from the second horizontal direction hd2 by at least 0.5 degree; and a third feature that the second crystallographic lattice direction is azimuthally offset from the third horizontal direction hd3 and from the fourth horizontal direction hd4 by at least 0.5 degree. In one embodiment, the fan-out package may comprise the first feature only, the second feature only, or the third feature only. In another embodiment, the fan-out package may comprise the first feature and the second feature, the first feature and the third feature, or the second feature and the third feature. In another embodiment, the fan-out package may include the first feature, the second feature, and the third feature.

In one embodiment, the third horizontal direction hd3 is azimuthally offset from the first horizontal direction hd1 by an azimuthal offset angle in a range from 0.5 degree to 89.5 degrees. In one embodiment, the third horizontal direction may be azimuthally offset from the first horizontal direction hd1 by an azimuthal offset angle in a range from 3 degrees to 87 degrees. In one embodiment, the third horizontal direction may be azimuthally offset from the first horizontal direction hd1 by an azimuthal offset angle in a range from 5 degrees to 85 degrees. In one embodiment, the third horizontal direction may be azimuthally offset from the first horizontal direction hd1 by an azimuthal offset angle in a range from 3 degrees to 42 degrees or in a range from 48 degrees to 87 degrees. In one embodiment, the third horizontal direction may be azimuthally offset from the first horizontal direction hd1 by an azimuthal offset angle in a range from 5 degrees to 43 degrees or in a range from 50 degrees to 85 degrees.

In one embodiment, the primary single crystalline semiconductor substrate may comprises a (100) silicon substrate (i.e., a silicon substrate having a <100> direction, such as a direction, as a surface normal direction), and/or the complementary single crystalline semiconductor substrate may comprises a (100) silicon substrate (i.e., a silicon substrate having a <100> direction, such as a direction.

In one embodiment, the first crystallographic lattice direction is azimuthally offset from the first horizontal direction hd1 by an azimuthal offset angle in a range from 0.5 degree to 89.5 degrees. In one embodiment, the first crystallographic lattice direction may be azimuthally offset from the first horizontal direction hd1 by an azimuthal offset angle in a range from 3 degrees to 87 degrees. In one embodiment, the first crystallographic lattice direction may be azimuthally offset from the first horizontal direction hd1 by an azimuthal offset angle in a range from 5 degrees to 85 degrees. In one embodiment, the first crystallographic lattice direction may be azimuthally offset from the first horizontal direction hd1 by an azimuthal offset angle in a range from 3 degrees to 42 degrees or in a range from 48 degrees to 87 degrees. In one embodiment, the first crystallographic lattice direction may be azimuthally offset from the first horizontal direction hd1 by an azimuthal offset angle in a range from 5 degrees to 43 degrees or in a range from 50 degrees to 85 degrees.

Alternatively or additionally, the second crystallographic lattice direction is azimuthally offset from the first horizontal direction hd1 by an azimuthal offset angle in a range from 0.5 degree to 89.5 degrees. In one embodiment, the second crystallographic lattice direction may be azimuthally offset from the first horizontal direction hd1 by an azimuthal offset angle in a range from 3 degrees to 87 degrees. In one embodiment, the second crystallographic lattice direction may be azimuthally offset from the first horizontal direction hd1 by an azimuthal offset angle in a range from 5 degrees to 85 degrees. In one embodiment, the second crystallographic lattice direction may be azimuthally offset from the first horizontal direction hd1 by an azimuthal offset angle in a range from 3 degrees to 42 degrees or in a range from 48 degrees to 87 degrees. In one embodiment, the second crystallographic lattice direction may be azimuthally offset from the first horizontal direction hd1 by an azimuthal offset angle in a range from 5 degrees to 43 degrees or in a range from 50 degrees to 85 degrees.

In one embodiment, the primary-level molding compound layer 130' comprises a first pair of primary-mold sidewalls that are parallel to the first horizontal direction hd1 and a second pair of primary-mold sidewalls that are parallel to the second horizontal direction hd2. The complementary-level molding compound layer 110' comprises a first pair of complementary-mold sidewalls that are parallel to the first horizontal direction hd1 and a second pair of complementary-mold sidewalls that are parallel to the second horizontal direction hd2. In one embodiment, the first pair of primary-mold sidewalls and the first pair of complementary-mold sidewalls are located entirely within a pair of first vertical planes, which may be a pair of Euclidean two-dimensional planes that are perpendicular to the second horizontal direction hd2. The second pair of primary-mold sidewalls and the second pair of complementary-mold sidewalls are located entirely within a pair of second vertical plane, which may be a pair of Euclidean two-dimensional planes that are perpendicular to the first horizontal direction hd1.

In one embodiment, the fan-out package comprises an inter-mold underfill layer 120' located between the primary-level molding compound layer 130' and the complementary-level molding compound layer 110' and laterally surrounding an array of metal bonding structures providing electrical connection between the primary semiconductor die 80 and the first complementary die 71.

In one embodiment, the array of metal bonding structures comprises a rectangular array of solder balls bonded to a respective mating pair of metal pads or a rectangular array of solder material portions bonded to a respective pair of copper pillar bumps; and the rectangular array of solder balls has a first periodicity along the third horizontal direction hd3 and a second periodicity along the fourth horizontal direction hd4 (for example, as illustrated in FIG. 8).

In one embodiment, the second crystallographic lattice direction may be azimuthally offset from the first crystallographic lattice direction; and the fan-out package comprises at least one feature selected from: a first additional feature that the primary-level molding compound layer 130' comprises a first pair of primary-mold sidewalls that are parallel to the first horizontal direction hd1 and a second pair of primary-mold sidewalls that are parallel to the second horizontal direction hd2, and a second feature that the complementary-level molding compound layer 110' may include a first pair of complementary-mold sidewalls that are parallel to the first horizontal direction hd1 and a second pair of complementary-mold sidewalls that are parallel to the second horizontal direction hd2.

In one embodiment, the fan-out package comprises a second complementary die 72 that overlies or underlies, and is bonded to, the primary semiconductor die 80, laterally surrounded by the complementary-level molding compound layer 110', laterally spaced from the first complementary die 71, and comprising a third pair of complementary-die sidewalls laterally extending along a fifth horizontal direction hd5 that is not parallel to the first horizontal direction hd1, the second horizontal direction hd2, the third horizontal direction hd3, or the fourth horizontal direction hd4, and comprising a fourth pair of complementary-die sidewalls laterally extending along a sixth horizontal direction hd6 that is perpendicular to the fifth horizontal direction hd5.

In one embodiment, the fan-out package comprises an additional complementary die (such as a third complementary die 73) that overlies or underlies, and is bonded to, the first complementary die 71, laterally surrounded by the complementary-level molding compound layer 110', and comprising a first additional pair of complementary-die sidewalls laterally extending along a first additional horizontal direction (such as the seventh horizontal direction hd7) that is not parallel to the first horizontal direction hd1, the second horizontal direction hd2, the third horizontal direction hd3, or the fourth horizontal direction hd4 (and optionally not parallel to the fifth horizontal direction hd5 and the sixth horizontal direction hd6), and comprising a second additional pair of complementary-die sidewalls laterally extending along a second additional horizontal direction (such as the eighth horizontal direction hd8) that is perpendicular to the first additional horizontal direction.

In one embodiment, sidewalls of the inter-mold underfill layer 120' may be vertically coincident with the primary-mold sidewalls of the primary-level molding compound layer 130' and with the complementary-mold sidewalls of the complementary-level molding compound layer 110'.

In one embodiment, all major in-plane crystallographic directions of the primary semiconductor die 80 may be azimuthally offset at least by 0.5 degree (and/or at least 1.0 degrees, and/or at least 2 degrees, and/or at least 3 degrees, and/or at least 4 degrees, and/or at least 5 degrees, and/or at least 6 degrees, and/or at least 8 degrees, and/or at least 10 degrees) from each major in-plane crystallographic direction of the complementary dies (71, 72, 73). Additionally or alternatively, all major in-plane crystallographic directions of the primary semiconductor die 80 may be azimuthally offset at least by 0.5 degree (and/or at least 1.0 degrees, and/or at least 2 degrees, and/or at least 3 degrees, and/or at least 4 degrees, and/or at least 5 degrees, and/or at least 6 degrees, and/or at least 8 degrees, and/or at least 10 degrees) from each major in-plane crystallographic direction of a carrier substrate 100 that is used during the manufacture process in embodiments in which the carrier substrate 100 comprises a single crystalline material such as a single crystalline semiconductor material. Additionally or alternatively, all major in-plane crystallographic directions of the complementary semiconductor substrates 701 of the complementary dies (71, 72, 73, 74) may be azimuthally offset from one another at least by 0.5 degree (and/or at least 1.0 degrees, and/or at least 2 degrees, and/or at least 3 degrees, and/or at least 4 degrees, and/or at least 5 degrees, and/or at least 6 degrees, and/or at least 8 degrees, and/or at least 10 degrees).

Additionally or alternatively, lengthwise sidewalls and widthwise sidewalls of the complementary semiconductor substrates 701 of the complementary dies (71, 72, 73, 74) may be azimuthally offset from the directions of periodicity used during manufacture (such as the first horizontal direction hd1 and the second horizontal direction hd2 illustrated in FIGS. 1A, 1B, 2A, 2B, 5A, 5B, 6A, 6B, 9A, and 9B) at least by 0.5 degree (and/or at least 1.0 degrees, and/or at least 2 degrees, and/or at least 3 degrees, and/or at least 4 degrees, and/or at least 5 degrees, and/or at least 6 degrees, and/or at least 8 degrees, and/or at least 10 degrees). Additionally or alternatively, lengthwise sidewalls and widthwise sidewalls of the complementary semiconductor substrates 701 of the complementary dies (71, 72, 73, 74) may be azimuthally offset from one another at least by 0.5 degree (and/or at least 1.0 degrees, and/or at least 2 degrees, and/or at least 3 degrees, and/or at least 4 degrees, and/or at least 5 degrees, and/or at least 6 degrees, and/or at least 8 degrees, and/or at least 10 degrees).

While the present disclosure is described using an embodiment in which an array of complementary die sets 70 and an array of primary semiconductor dies 80 are bonded to each other, at least one additional array of additional complementary die sets (not shown) may be vertically stacked above, or below, the stack of the array of complementary die sets 70 and the array of primary semiconductor dies 80. In this embodiment, additional complementary dies may be incorporated into each fan-out package of the present disclosure. As discussed above, the major in-plane crystallographic directions of such additional complementary dies may be azimuthally offset from the directions of periodicity used during manufacture (such as the first horizontal direction hd1 and the second horizontal direction hd2 illustrated in FIGS. 1A, 1B, 2A, 2B, 5A, 5B, 6A, 6B, 9A, and 9B) at least by 0.5 degree (and/or at least 1.0 degrees, and/or at least 2 degrees, and/or at least 3 degrees, and/or at least 4 degrees, and/or at least 5 degrees, and/or at least 6 degrees, and/or at least 8 degrees, and/or at least 10 degrees). Additionally or alternatively, lengthwise sidewalls and widthwise sidewalls of complementary semiconductor substrates of such additional complementary dies may be azimuthally offset from one another, and from the horizontal directions of sidewall of the primary semiconductor die 80 and the complementary dies (71, 72, 73), at least by 0.5 degree (and/or at least 1.0 degrees, and/or at least 2 degrees, and/or at least 3 degrees, and/or at least 4 degrees, and/or at least 5 degrees, and/or at least 6 degrees, and/or at least 8 degrees, and/or at least 10 degrees).

Figure 12:
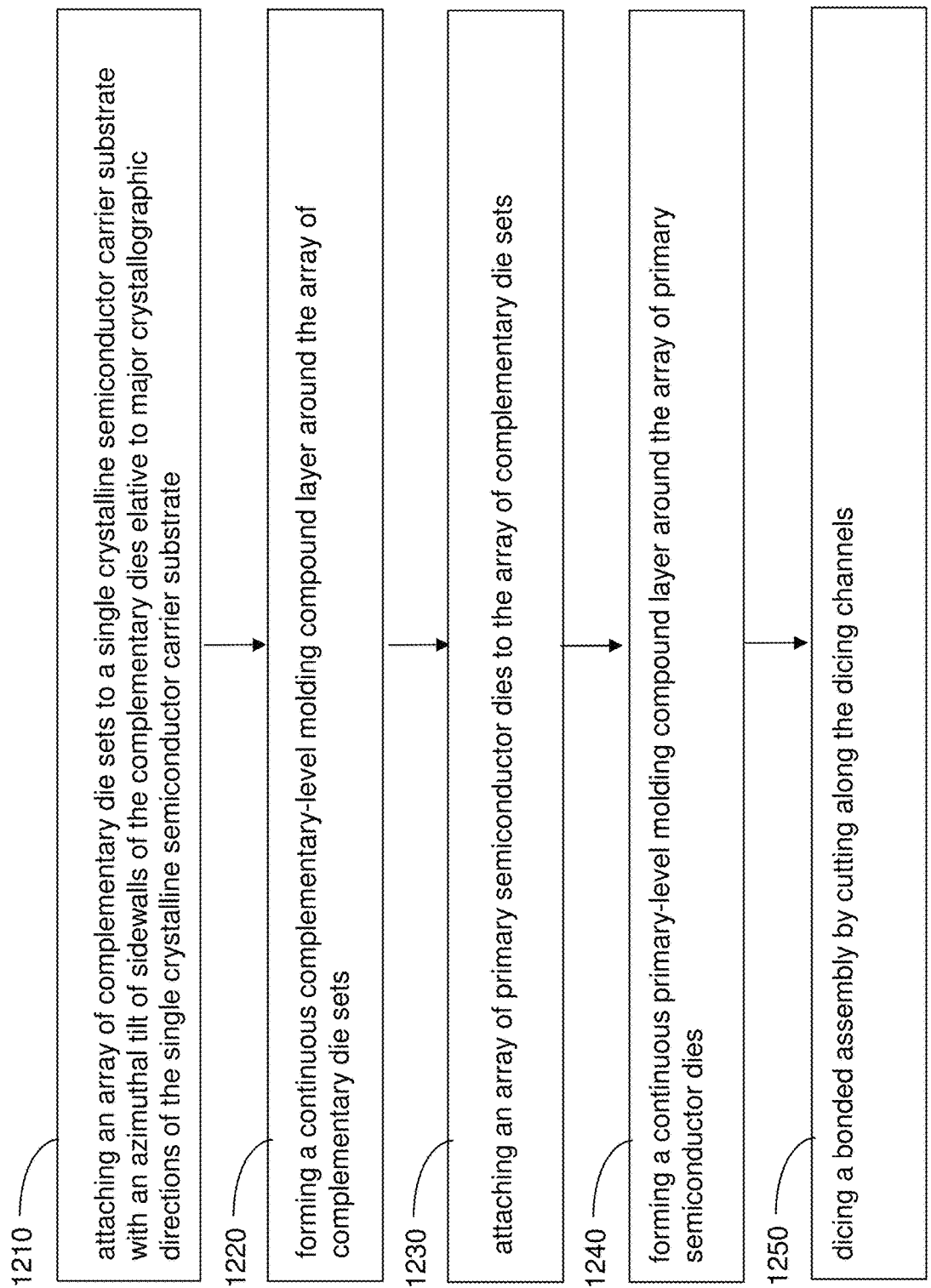
FIG. 12 is a first flowchart illustrating steps for forming the first or second exemplary structure according to an embodiment of the present disclosure.

FIG. 12 is a first flowchart illustrating steps for forming the first or second exemplary structure according to an embodiment of the present disclosure.

Referring to step 1210 and FIGS. 1A, 1B, 5A, and 5B, an array of complementary die sets 70 may be attached to a carrier substrate 100 (within may be a single crystalline semiconductor carrier substrate). The array of complementary die sets 70 has a first periodicity along a first horizontal direction hd1 and has a second periodicity along a second horizontal direction hd2 that is perpendicular to the first horizontal direction hd1. Each complementary die set may include a first complementary die 71 comprising a first pair of complementary-die sidewalls laterally extending along a third horizontal direction hd3 and comprising a second pair of complementary-die sidewalls laterally extending along a fourth horizontal direction hd4 that is perpendicular to the third horizontal direction hd3. In some embodiments, the carrier substrate 100 may comprise a single crystalline semiconductor carrier substrate such as a (100) silicon substrate, and the array of complementary die sets 70 may be attached to the ingle crystalline semiconductor carrier substrate with an azimuthal tilt of sidewalls of the complementary dies within the complementary die sets 70 relative to major in-plane crystallographic directions of the single crystalline semiconductor carrier substrate 100. In one embodiment, each of major in-plane crystallographic directions within the single crystalline semiconductor carrier substrate may be azimuthally offset from the first horizontal direction hd1 and from the second horizontal direction hd2 by at least 0.5 degree. The azimuthal tilt angle between the major in-plane crystallographic directions within the single crystalline semiconductor carrier substrate and the first horizontal direction hd1 may be in a range from 0.5 degree to 44.5 degrees such as from 3 degrees to 42 degrees and/or from 5 degrees to 40 degrees, or may be in a range from 45.5 degrees to 89.5 degrees such as from 48 degrees to 87 degrees and/or from 50 degrees to 85 degrees.

Referring to step 1220 and FIGS. 1A, 1B, 5A, and 5B, a continuous complementary-level molding compound layer 110 may be formed around the array of complementary die sets 70 and over the single crystalline semiconductor carrier substrate 100.

Referring to step 1230 and FIGS. FIGS. 2A, 2B, 6A, and 6B, an array of primary semiconductor dies 80 may be attached to the array of complementary die sets 70.

Referring to step 1240 and FIGS. FIGS. 2A, 2B, 6A, and 6B, a continuous primary-level molding compound layer 130 may be formed around the array of primary semiconductor dies 80.

Referring to step 1250 and FIGS. 3A, 3B, 4, 7, and 8, a bonded assembly including the array of primary semiconductor dies 80, the continuous primary-level molding compound layer 130, the array of complementary die sets 70, the continuous complementary-level molding compound layer 110, and the single crystalline semiconductor carrier substrate 100 may be diced into a plurality of fan-out packages by cutting the bonded assembly along first dicing channels that are parallel to the first horizontal direction hd1 and along second dicing channel that are parallel to the second horizontal direction hd2.

According to an aspect of the present disclosure, the method of the present disclosure as described in FIG. 12 may include at least one feature selected from: a first feature that the third horizontal direction hd3 is not parallel to the first horizontal direction hd1 or the second horizontal direction hd2; a second feature that each of the primary semiconductor dies 80 comprises a respective primary single crystalline semiconductor substrate, and a <100> crystallographic direction of each of the primary single crystalline semiconductor substrate is aligned along a primary <100> crystallographic lattice direction (i.e., a <100> crystallographic lattice direction of a respective primary single crystalline semiconductor substrate) that may be azimuthally offset from the first horizontal direction hd1 and from the second horizontal direction hd2 by at least 0.5 degree (such as an azimuthal offset angle in a range from 0.5 degree to 44.5 degrees and/or from 3 degrees to 42 degrees and/or from 5 degrees to 40 degrees, or an azimuthal offset angle in a range from 45.5 degrees to 89.5 degrees and/or from 48 degrees to 87 degrees and/or from 50 degrees to 85 degrees); a third feature that each of the first complementary dies 71 comprises a respective complementary single crystalline semiconductor substrate, and a <100> crystallographic direction of each of the complementary single crystalline semiconductor substrates is aligned along a complementary <100> crystallographic lattice direction (i.e., a <100> crystallographic lattice direction of a respective complementary single crystalline semiconductor substrate) that may be azimuthally offset from the first horizontal direction hd1 and from the second horizontal direction hd2 by at least 0.5 degree such as an azimuthal offset angle in a range from 0.5 degree to 44.5 degrees and/or from 3 degrees to 42 degrees and/or from 5 degrees to 40 degrees, or an azimuthal offset angle in a range from 45.5 degrees to 89.5 degrees and/or from 48 degrees to 87 degrees and/or from 50 degrees to 85 degrees); and a fourth feature that the carrier substrate comprises a single crystalline carrier semiconductor substrate having a <100> crystallographic lattice direction that is azimuthally offset from the first horizontal direction hd1 and from the second horizontal direction hd2 by an azimuthal offset angle that is greater than 0.5 degree (such as an azimuthal offset angle in a range from 0.5 degree to 44.5 degrees and/or from 3 degrees to 42 degrees and/or from 5 degrees to 40 degrees, or an azimuthal offset angle in a range from 45.5 degrees to 89.5 degrees and/or from 48 degrees to 87 degrees and/or from 50 degrees to 85 degrees).

In one embodiment, each of the primary semiconductor dies 80 within the array of primary semiconductor dies 80 may include a first pair of primary-die sidewalls that are parallel to the first horizontal direction hd1 and a second pair of primary-die sidewalls that are parallel to the second horizontal direction hd2; and the method comprises a feature selected from: a first additional feature that the third horizontal direction hd3 may be parallel to the first horizontal direction hd1, and the fourth horizontal direction may be parallel to the second horizontal direction hd2; and a second additional feature that the third horizontal direction hd3 is azimuthally offset from the first horizontal direction hd1 by an azimuthal offset angle, the fourth horizontal direction hd4 may be azimuthally offset from the second horizontal direction hd2 by the azimuthal offset angle, and the azimuthal offset angle is in a range from 0.5 degree to 89.5 degrees. In one embodiment, the azimuthal offset angle may be in a range from 0.5 degree to 44.5 degrees and/or from 3 degrees to 42 degrees and/or from 5 degrees to 40 degrees, or in a range from 45.5 degrees to 89.5 degrees and/or from 48 degrees to 87 degrees and/or from 50 degrees to 85 degrees).

Figure 13:
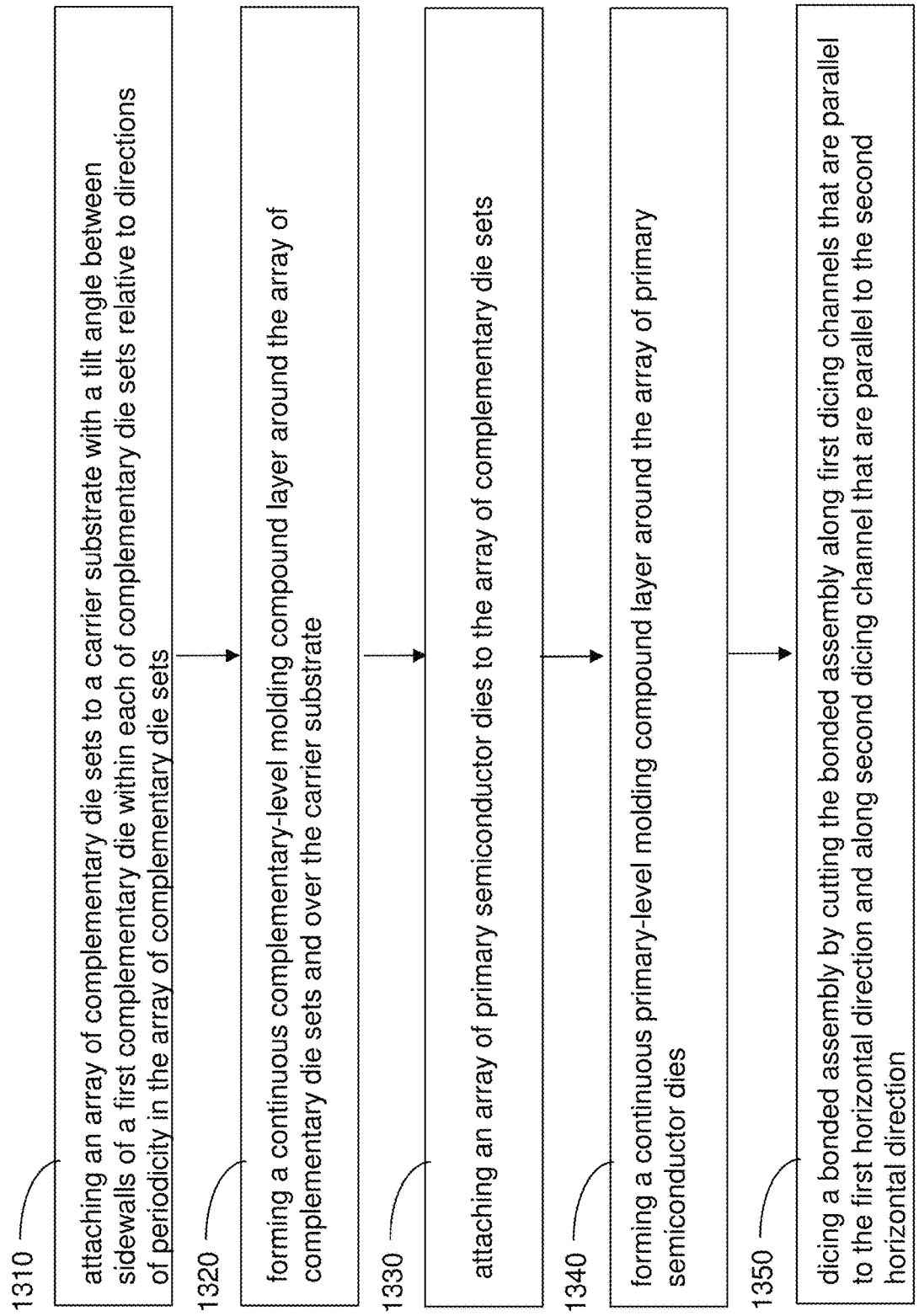
FIG. 13 is a second flowchart illustrating steps for forming the second or third exemplary structure according to an embodiment of the present disclosure.

FIG. 13 is a second flowchart illustrating steps for forming the second or third exemplary structure according to an embodiment of the present disclosure.

Referring to step 1310 and FIGS. 5A, 5B, 9A, and 9B and relevant portions of FIGS. 1A and 1B, an array of complementary die sets 70 may be attached to a carrier substrate 100 with a tilt angle greater than 0.5 degree between sidewalls of a first complementary die 71 within each of the complementary die sets 70 relative to directions of periodicity in the array of complementary die sets 70.

Referring to step 1320 and FIGS. 5A, 5B, 9A, and 9B and relevant portions of FIGS. 1A and 1B, a continuous complementary-level molding compound layer 110 may be formed around the array of complementary die sets 70 and over the carrier substrate 100.

Referring to step 1330 and FIGS. 6A, 6B, and 10 and relevant portions of FIGS. 2A and 2B, an array of primary semiconductor dies 80 may be attached to the array of complementary die sets 70.

Referring to step 1340 and FIGS. 6A, 6B, and 10 and relevant portions of FIGS. 2A and 2B, a continuous primary-level molding compound layer 130 may be formed around the array of primary semiconductor dies 80.

Referring to step 1350 and FIGS. 7, 8, and 11 and relevant portions of FIGS. 3A, 3B, and 4, a bonded assembly including the array of primary semiconductor dies 80, the continuous primary-level molding compound layer 130, the array of complementary die sets 70, the continuous complementary-level molding compound layer 110, and the carrier substrate 100 may be diced into a plurality of fan-out packages by cutting the bonded assembly along first dicing channels that are parallel to a first direction of periodicity of the array of complementary die sets 70 (such as the first horizontal direction hd1) and along second dicing channel that are parallel to a second direction of periodicity of the array of complementary die sets 70 (such as the second horizontal direction hd2).

Generally, the non-coincidence of the various in-plane major crystallographic directions of the carrier substrate 100, the complementary semiconductor substrate(s) 701, and the primary semiconductor substrate 801 from one another and relative to the directions of periodicity in the arrays of bonded sets of a primary semiconductor die 80 and a complementary die set 70 provides the benefit of frustrating continuous stress accumulation during assembly and dicing of the primary semiconductor dies 80 and the complementary die sets 70. Stress fractures and fragmentation during assembly and dicing processes may be avoided. The embodiments of the present disclosure may increase the stress resistance of the system-on-integrated-chip wafer and the fan-out wafer-level packages.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming fan-out packages, comprising:

attaching an array of complementary die sets to a carrier substrate, wherein the array of complementary die sets has a first periodicity along a first horizontal direction and has a second periodicity along a second horizontal direction that is different from the first horizontal direction, and wherein each complementary die set comprises a first complementary die comprising a first pair of complementary-die sidewalls laterally extending along a third horizontal direction and comprising a second pair of complementary-die sidewalls laterally extending along a fourth horizontal direction;

forming a continuous complementary-level molding compound layer around the array of complementary die sets and over the carrier substrate;

attaching an array of primary semiconductor dies to the array of complementary die sets;

forming a continuous primary-level molding compound layer around the array of primary semiconductor dies; and dicing a bonded assembly including the array of primary semiconductor dies, the continuous primary-level molding compound layer, the array of complementary die sets, the continuous complementary-level molding compound layer, and the carrier substrate into a plurality of fan-out packages by cutting the bonded assembly along first dicing channels that are parallel to the first horizontal direction and along second dicing channel that are parallel to the second horizontal direction, wherein:

the third horizontal direction is azimuthally offset from the first horizontal direction by an azimuthal offset angle;

the fourth horizontal direction is azimuthally offset from the second horizontal direction by the azimuthal offset angle; and the azimuthal offset angle is in a range from 0.5 degree to 89.5 degrees.

2. The method of claim 1, wherein the third horizontal direction is not parallel to the first horizontal direction or the second horizontal direction.

3. The method of claim 1, wherein each of the primary semiconductor dies comprises a respective primary single crystalline semiconductor substrate, and a <100> crystallographic direction of each of the primary single crystalline semiconductor substrate is aligned along a primary <100> crystallographic lattice direction that is azimuthally offset from the first horizontal direction and from the second horizontal direction by at least 0.5 degree.

4. The method of claim 1, wherein each of the first complementary dies comprises a respective complementary single crystalline semiconductor substrate, and a <100> crystallographic direction of each of the complementary single crystalline semiconductor substrates is aligned along a complementary <100> crystallographic lattice direction that is azimuthally offset from the first horizontal direction and from the second horizontal direction by at least 0.5 degree.

5. The method of claim 1, wherein the carrier substrate comprises a single crystalline carrier semiconductor substrate having a <100> crystallographic lattice direction that is azimuthally offset from the first horizontal direction and from the second horizontal direction.

6. The method of claim 1, wherein each of the primary semiconductor dies within the array of primary semiconductor dies comprises a first pair of primary-die sidewalls that are parallel to the first horizontal direction and a second pair of primary-die sidewalls that are parallel to the second horizontal direction.

7. The method of claim 1, wherein:
each of the first complementary dies comprises a respective first array of complementary metal bump structures;
the method comprises forming an array of solder portions on each first array of complementary metal bump structures, and forming a continuous inter-mold underfill layer around the array of solder portions and over the continuous complementary-level molding compound layer;
each of the primary semiconductor dies comprises an array of primary metal bump structures; and
the method comprises attaching the array of primary metal bump structures to the array of solder portions.

8. The method of claim 7, wherein each first array of complementary metal bump structures comprises a rectangular array having a first bump periodicity along the third horizontal direction and a second bump periodicity along the fourth horizontal direction.

9. The method of claim 1, wherein:
each complementary die set comprises a second complementary die comprising a third pair of complementary-die sidewalls laterally extending along a fifth horizontal direction that is not parallel to the first horizontal direction, the second horizontal direction, the third horizontal direction, or the fourth horizontal direction, and comprising a fourth pair of complementary-die sidewalls laterally extending along a sixth horizontal direction that is perpendicular to the fifth horizontal direction;
each second complementary die is bonded to a respective one of the primary semiconductor dies through an array of metal bonding structures that comprises a rectangular array of solder balls bonded to a respective mating pair of metal pads or a rectangular array of solder material portions bonded to a respective pair of copper pillar bumps; and
the rectangular array of solder balls has a bump periodicity along the fifth horizontal direction and an additional bump periodicity along the sixth horizontal direction.

10. The method of claim 1, wherein:
each complementary die set comprises a second complementary die comprising a third pair of complementary-die sidewalls laterally extending along a first additional horizontal direction that is not parallel to the first horizontal direction, the second horizontal direction, the third horizontal direction, or the fourth horizontal direction, and comprising a fourth pair of complementary-die sidewalls laterally extending along a second additional horizontal direction that is perpendicular to the first additional horizontal direction;
each second complementary die is bonded to the first complementary die within a same complementary die set through an array of metal bonding structures that comprises a rectangular array of solder balls bonded to a respective mating pair of metal pads or a rectangular array of solder material portions bonded to a respective pair of copper pillar bumps; and
the rectangular array of solder balls has a bump periodicity along the first additional horizontal direction and an additional bump periodicity along the second additional horizontal direction.

11. A method of forming fan-out packages, comprising:
attaching an array of complementary die sets to a carrier substrate with a tilt angle greater than 0.5 degree between sidewalls of a first complementary die within each of the complementary die sets relative to directions of periodicity in the array of complementary die sets;
forming a continuous complementary-level molding compound layer around the array of complementary die sets and over the carrier substrate;
attaching an array of primary semiconductor dies to the array of complementary die sets; and
dicing a bonded assembly including the array of primary semiconductor dies, the array of complementary die sets, the continuous complementary-level molding compound layer, and the carrier substrate into a plurality of fan-out packages,
wherein each of the primary semiconductor dies comprises a respective primary single crystalline semiconductor substrate, and a <100> crystallographic direction of each of the primary single crystalline semiconductor substrate is aligned along a primary <100> crystallographic lattice direction that is azimuthally offset from the first horizontal direction and from the second horizontal direction by at least 0.5 degree.

12. The method of claim 11, further comprising forming a continuous primary-level molding compound layer around the array of primary semiconductor dies, wherein the bonded assembly comprises the continuous primary-level molding compound layer.

13. The method of claim 11, wherein the bonded assembly is diced by cutting the bonded assembly along first dicing channels that are parallel to a first direction of periodicity of the array of complementary die sets and along second dicing channel that are parallel to a second direction of periodicity of the array of complementary die sets.

14. The method of claim 11, wherein the array of complementary die sets has a first periodicity along a first horizontal direction and has a second periodicity along a second horizontal direction that is perpendicular to the first horizontal direction.

15. The method of claim 14, wherein each of major in-plane crystallographic directions within the carrier substrate is azimuthally offset from the first horizontal direction and from the second horizontal direction by at least 0.5 degree.

16. The method of claim 14, wherein the first complementary die comprises:

a first pair of complementary-die sidewalls laterally extending along a third horizontal direction that is not parallel to the first horizontal direction or the second horizontal direction; and a second pair of complementary-die sidewalls laterally extending along a fourth horizontal direction that is perpendicular to the third horizontal direction.

17. A method of forming fan-out packages, comprising:

attaching an array of complementary die sets to a carrier substrate with a tilt angle greater than 0.5 degree between sidewalls of a first complementary die within each of the complementary die sets relative to directions of periodicity in the array of complementary die sets;

forming a continuous complementary-level molding compound layer around the array of complementary die sets and over the carrier substrate;

attaching an array of primary semiconductor dies to the array of complementary die sets; and dicing a bonded assembly including the array of primary semiconductor dies, the array of complementary die sets, the continuous complementary-level molding compound layer, and the carrier substrate into a plurality of fan-out packages, wherein each of the first complementary dies comprises a respective complementary single crystalline semiconductor substrate, and a <100> crystallographic direction of each of the complementary single crystalline semiconductor substrates is aligned along a complementary <100> crystallographic lattice direction that is azimuthally offset from the first horizontal direction and from the second horizontal direction by at least 0.5 degree.

18. The method of claim 17, wherein:

each of the first complementary dies comprises a respective first array of complementary metal bump structures;

the method comprises forming an array of solder portions on each first array of complementary metal bump structures, and forming a continuous inter-mold underfill layer around the array of solder portions and over the continuous complementary-level molding compound layer;

each of the primary semiconductor dies comprises an array of primary metal bump structures; and the method comprises attaching the array of primary metal bump structures to the array of solder portions.

19. The method of claim 17, wherein:

the array of complementary die sets has a first periodicity along a first horizontal direction and has a second periodicity along a second horizontal direction;

each complementary die set comprises the first complementary die comprising a first pair of complementary-die sidewalls laterally extending along a third horizontal direction and comprising a second pair of complementary-die sidewalls laterally extending along a fourth horizontal direction;

the third horizontal direction is azimuthally offset from the first horizontal direction by an azimuthal offset angle;

the fourth horizontal direction is azimuthally offset from the second horizontal direction by the azimuthal offset angle; and the azimuthal offset angle is in a range from 0.5 degree to 89.5 degrees.

20. The method of claim 17, wherein:

each of the first complementary dies comprises a respective first array of complementary metal bump structures;

the method comprises forming an array of solder portions on each first array of complementary metal bump structures, and forming a continuous inter-mold underfill layer around the array of solder portions and over the continuous complementary-level molding compound layer;

each of the primary semiconductor dies comprises an array of primary metal bump structures; and the method comprises attaching the array of primary metal bump structures to the array of solder portions.

* * * * *